United States Patent
Ho et al.

(10) Patent No.: US 12,107,163 B2
(45) Date of Patent: Oct. 1, 2024

(54) SEMICONDUCTOR DEVICE STRUCTURE HAVING DISLOCATION STRESS MEMORIZATION AND METHODS OF FORMING THE SAME

(71) Applicant: TAIWAN SEMICONDUCTOR MANUFACTURING COMPANY, LTD., Hsinchu (TW)

(72) Inventors: Tsai-Jung Ho, Changhua (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 639 days.

(21) Appl. No.: 17/406,395

(22) Filed: Aug. 19, 2021

(65) Prior Publication Data

US 2023/0064376 A1    Mar. 2, 2023

(51) Int. Cl.
| | |
|---|---|
| H01L 21/265 | (2006.01) |
| H01L 29/04 | (2006.01) |
| H01L 29/66 | (2006.01) |
| H01L 29/78 | (2006.01) |
| H01L 21/8238 | (2006.01) |

(52) U.S. Cl.
CPC ......... *H01L 29/7847* (2013.01); *H01L 29/04* (2013.01); *H01L 29/66545* (2013.01); *H01L 29/66795* (2013.01); *H01L 29/7848* (2013.01); *H01L 21/823814* (2013.01); *H01L 21/823821* (2013.01)

(58) Field of Classification Search
None
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,419,136 B2 | 8/2016 | Yu et al. | |
| 9,520,482 B1 | 12/2016 | Chang et al. | |
| 9,576,814 B2 | 2/2017 | Wu et al. | |

(Continued)

*Primary Examiner* — Joseph C. Nicely
*Assistant Examiner* — Lamont B Koo
(74) *Attorney, Agent, or Firm* — NZ CARR LAW OFFICE

(57) ABSTRACT

A semiconductor device structure, along with methods of forming such, are described. In one embodiment, a method for forming a semiconductor device structure is provided. The method includes forming a sacrificial gate structure over a portion of a semiconductor fin, forming a gate spacer on opposing sides of the sacrificial gate structure, forming an amorphized region in the semiconductor fin not covered by the sacrificial gate structure and the gate spacer, wherein the amorphized region has an amorphous-crystalline interface having a first roughness, forming a stressor layer over the amorphized region, wherein the formation of the stressor layer recrystallizes the amorphous-crystalline interface from the first roughness to a second roughness that is less than the first roughness, and subjecting the amorphized region to an annealing process to recrystallize the amorphized region to a crystalline region, and the crystalline region comprising a dislocation.

20 Claims, 17 Drawing Sheets

(56) References Cited

U.S. PATENT DOCUMENTS

| | | | |
|---|---|---|---|
| 9,608,116 B2 | 3/2017 | Ching et al. | |
| 9,812,363 B1 | 11/2017 | Liao et al. | |
| 9,859,380 B2 | 1/2018 | Lee et al. | |
| 2013/0200455 A1* | 8/2013 | Lo | H01L 29/785 |
| | | | 257/E21.409 |
| 2015/0295085 A1* | 10/2015 | Yu | H01L 29/1083 |
| | | | 438/197 |
| 2020/0035811 A1* | 1/2020 | Huang | H01L 29/785 |

* cited by examiner

SEMICONDUCTOR DEVICE STRUCTURE HAVING DISLOCATION STRESS MEMORIZATION AND METHODS OF FORMING THE SAME

BACKGROUND

In recent years, strain engineering has become a widely used method of improving the performance of transistor devices. Strain engineering induces a stress applied onto either a channel region and/or onto source and drain regions of a transistor device. The stress stretches the crystalline lattice of region(s) to increase the distance between atoms beyond their normal inter-atomic distance. By stretching the crystalline lattice, strain engineering increases charge carrier mobility and thereby improves device performance. Although existing approaches of strain engineering has been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
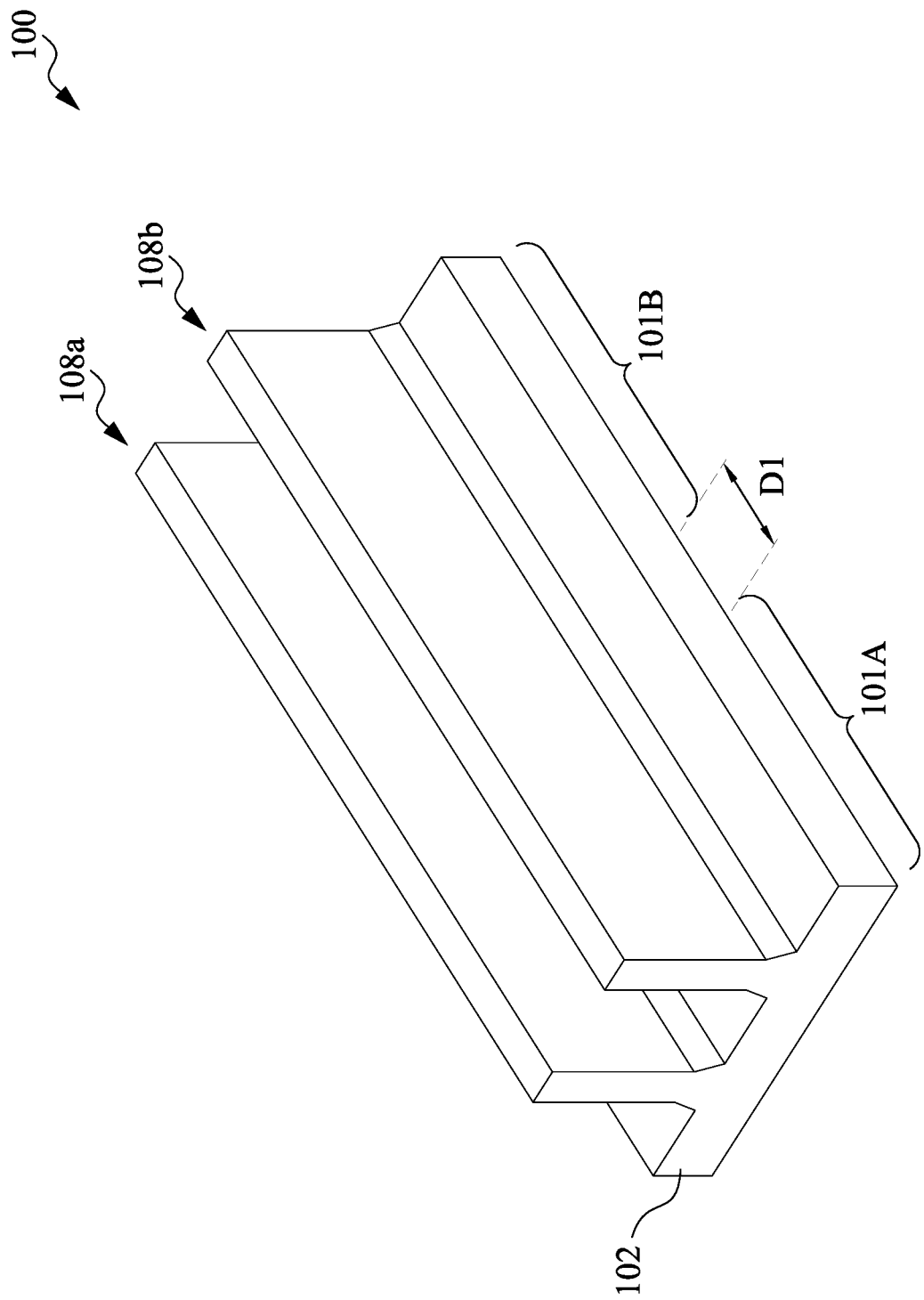
FIGS. 1-3 are perspective views of intermediate stages in the manufacturing of the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-17 illustrate various stages of manufacturing a semiconductor device structure 100 in accordance with various embodiments of this disclosure. It is understood that additional operations can be provided before, during, and after processes shown by FIGS. 1-17 and some of the operations described below can be replaced or eliminated, for additional embodiments of the method. The order of the operations/processes may be interchangeable.

Figure 2:
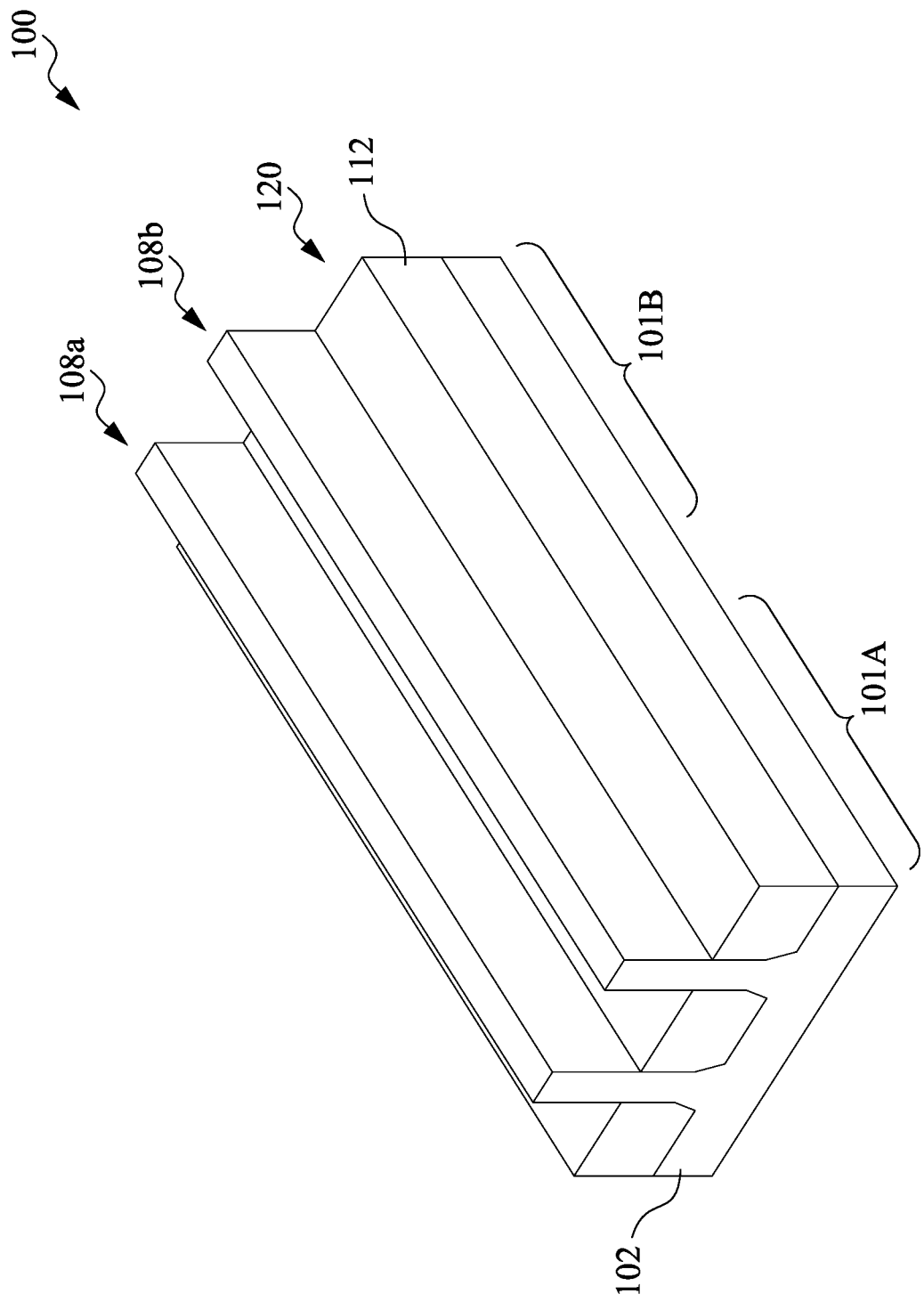
Figure 3:
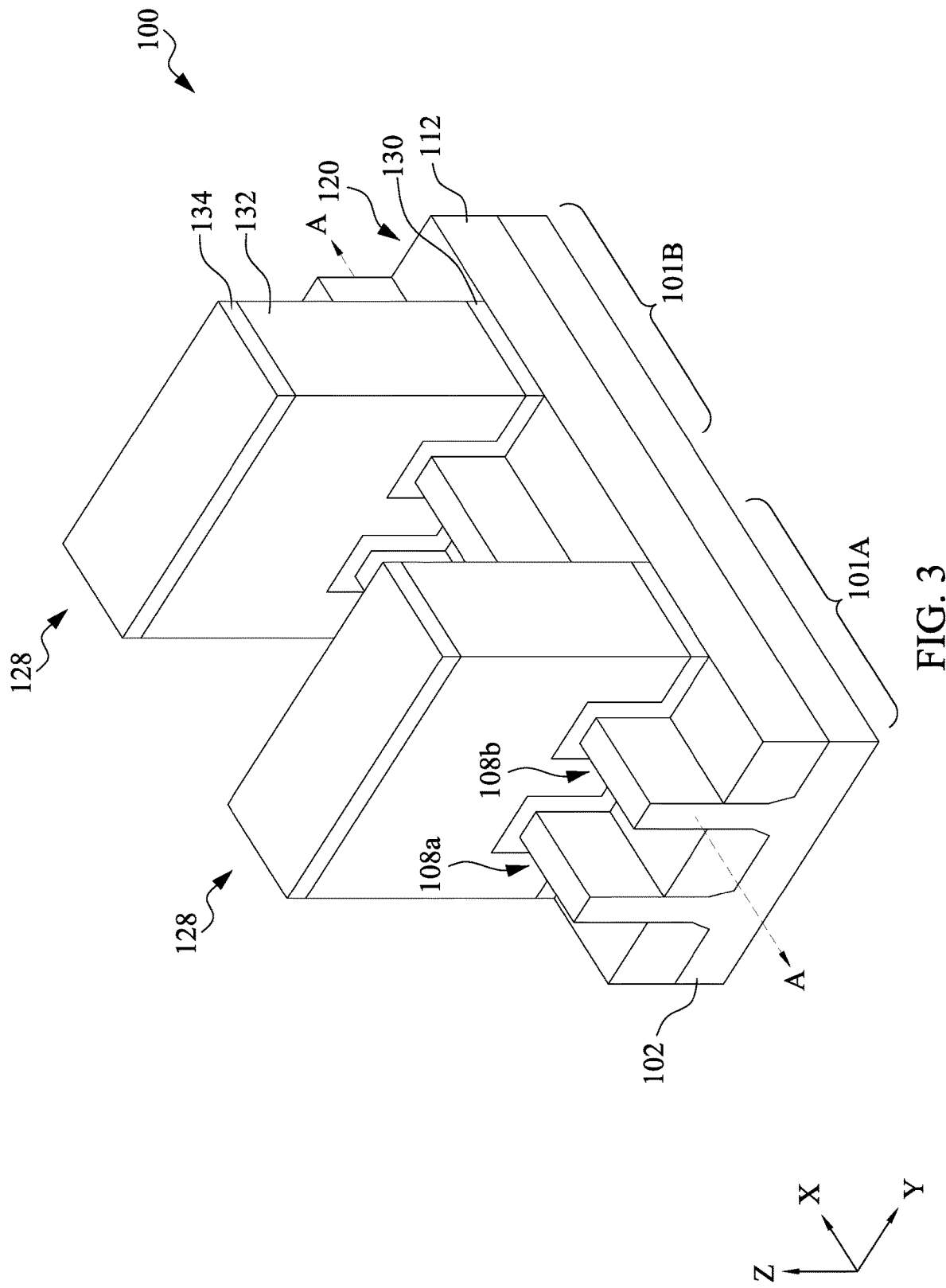

FIGS. 1-3 are perspective views of intermediate stages in the manufacturing of the semiconductor device structure 100, in accordance with some embodiments. In FIG. 1, a semiconductor substrate 102 is provided. The substrate 102 may be or include a bulk semiconductor substrate, a semiconductor-on-insulator (SOI) substrate, or the like, which may be doped (with a p-type or n-type dopant) or undoped. The substrate 102 may include silicon or another elementary semiconductor material such as germanium. In some embodiments, the substrate 102 includes a compound semiconductor. The compound semiconductor may include gallium arsenide, silicon carbide, indium arsenide, indium phosphide, another suitable semiconductor material, or a combination thereof.

The substrate 102 includes a first portion in region 101A and a second portion in region 101B. The first and second portions belong to a continuous substrate 102. The region 101A and the region 101B may be separated from each other by a region having a distance D1, which may be any suitable distance depending on the application. Isolation regions (not shown), such as isolation region 131 (FIGS. 4-17) may be formed in the region between the region 101A and the region 101B. While the region 101A is shown adjacent to the region 101B along the X direction, the region 101A may be located at different regions of the substrate 102 along the Y direction. The region 101A and the region 101B may be of different types, and are referred to in accordance with the types of devices formed therein. In some embodiments, the region 101A is a logic device region for forming logic transistors therein. The logic device region may not include any memory array therein, and may be, or may not be, in the peripheral region of SRAM arrays. In some embodiments, the region 101B is a Static Random Access Memory (SRAM) region, in which SRAM cells and transistors are formed. The regions 101A and 101B may include both p-type metal-oxide-semiconductor (PMOS) devices and n-type metal-oxide-semiconductor NMOS devices therein. In some embodiments, the region 101A includes NMOS devices and the region 101B includes PMOS devices. In some embodiments, the region 101A may be a multi-fin FinFET region and the region 101B may be a single-fin FinFET region, or vice versa. In some embodiments, the regions 101A and 101B may be planar devices regions including planar transistors. While embodiments described in this disclosure are described in the context of FinFETs, implementations of some aspects of the present disclosure may be used in other processes and/or in other devices, such as planar FETs, nanostructure channel FETs, Horizontal Gate All Around (HGAA) FETs, Vertical Gate All Around (VGAA) FETs, and other suitable devices.

A plurality of fins 108a, 108b are formed from the substrate 102. The fins 108a, 108b may be formed by patterning a hard mask layer (not shown) formed on the top of the fins 108a, 108b using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins. Portions of the fins 108a, 108b may serve as channels in the subsequently formed NMOS, PMOS devices in the region 101A, 101B, respectively. While not shown, a hard mask layer may be formed on top of the fins 108a, 108b.

In FIG. 2, an insulating material 112 is formed between adjacent fins 108a, 108b. The insulating material 112 may be first formed between adjacent fins 108a, 108b and over the fins 108a, 108b, so the fins 108a, 108b are embedded in the insulating material 112. A planarization process, such as a chemical-mechanical polishing (CMP) process may be performed to expose the top of the fins 108a, 108b. In some embodiments, the planarization process exposes the top of the hard mask layer (not shown) disposed on the fins 108a, 108b. The insulating material 112 are then recessed so that a top surface of the insulating material 112 is lower than a top surface of the fins 108a, 108b, thereby forming a shallow trench isolation (STI) region 120. The insulating material 112 may be recessed by any suitable removal process, such as dry etch or wet etch that selectively removes the insulating material 112 but does not substantially affect the fins 108a, 108b. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD).

In FIG. 3, one or more sacrificial gate stacks 128 are formed on a portion of the fins 108a, 108b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 includes a material different than that of the insulating material 112. The sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a, 108b are partially exposed on opposite sides of the sacrificial gate stacks 128. While two sacrificial gate stacks 128 are shown in FIG. 3, it can be appreciated that they are for illustrative purpose only and any number of the sacrificial gate stacks 128 may be formed.

FIGS. 4-17 are cross-sectional side views of various stages of manufacturing the semiconductor device structure 100 of FIG. 3 taken along line A-A, in accordance with some embodiments. In various embodiments, one or more isolation regions 131 (only one is shown) are formed in a region between the region 101A and the region 101B. The isolation regions 131 may extend from a top surface of the fins 108a, 108b into the fins 108a, 108b. In some embodiments, the isolation regions 131 are STI regions, which may be formed by etching the substrate 102 during formation of the fins 108a, 108b to form fins 108a, 108b and trenches in the fins 108a, 108b along the X direction, and filling the trenches with a dielectric material (e.g., insulating material 112) to form isolation regions 131.

Figure 4:
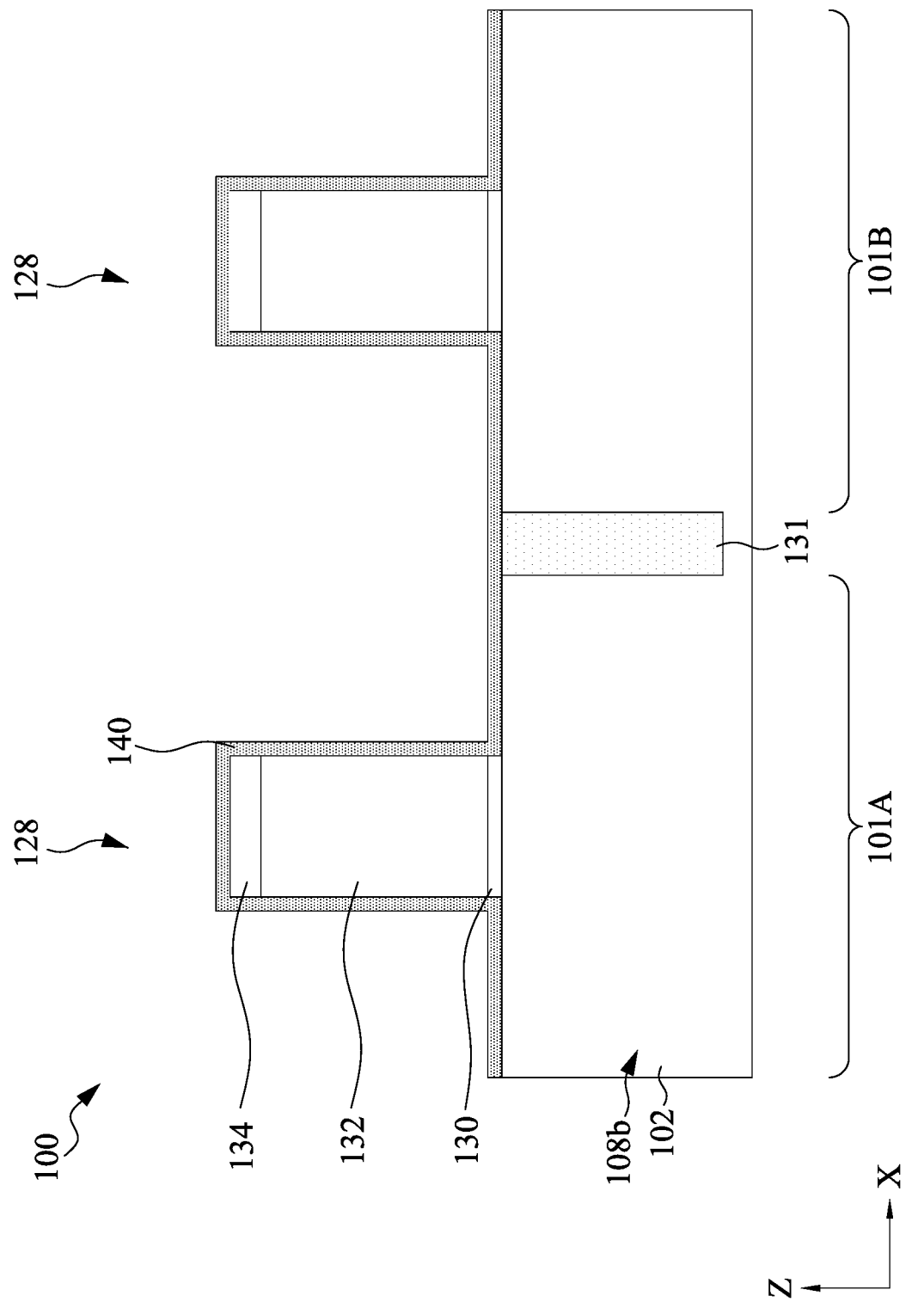
FIGS. 4-17 are cross-sectional side views of various stages of manufacturing the semiconductor device structure of FIG. 3 taken along line A-A, in accordance with some embodiments.

In FIG. 4, after formation of the sacrificial gate structures 128, gate spacers 140 are conformally formed on the sacrificial gate structures 128, the exposed portions of the fins 108a, 108b, the isolation region 131, and the insulating material 112. The gate spacer 140 may be formed by ALD or any suitable processes. The gate spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, or any combinations thereof. The gate spacer 140 may be a bi-layer or tri-layer structure including multiple layers of the dielectric material discussed herein. The gate spacers 140 may have an overall thickness of about 2 nm to about 20 nm, for example about 4 nm to about 10 nm.

Figure 5:
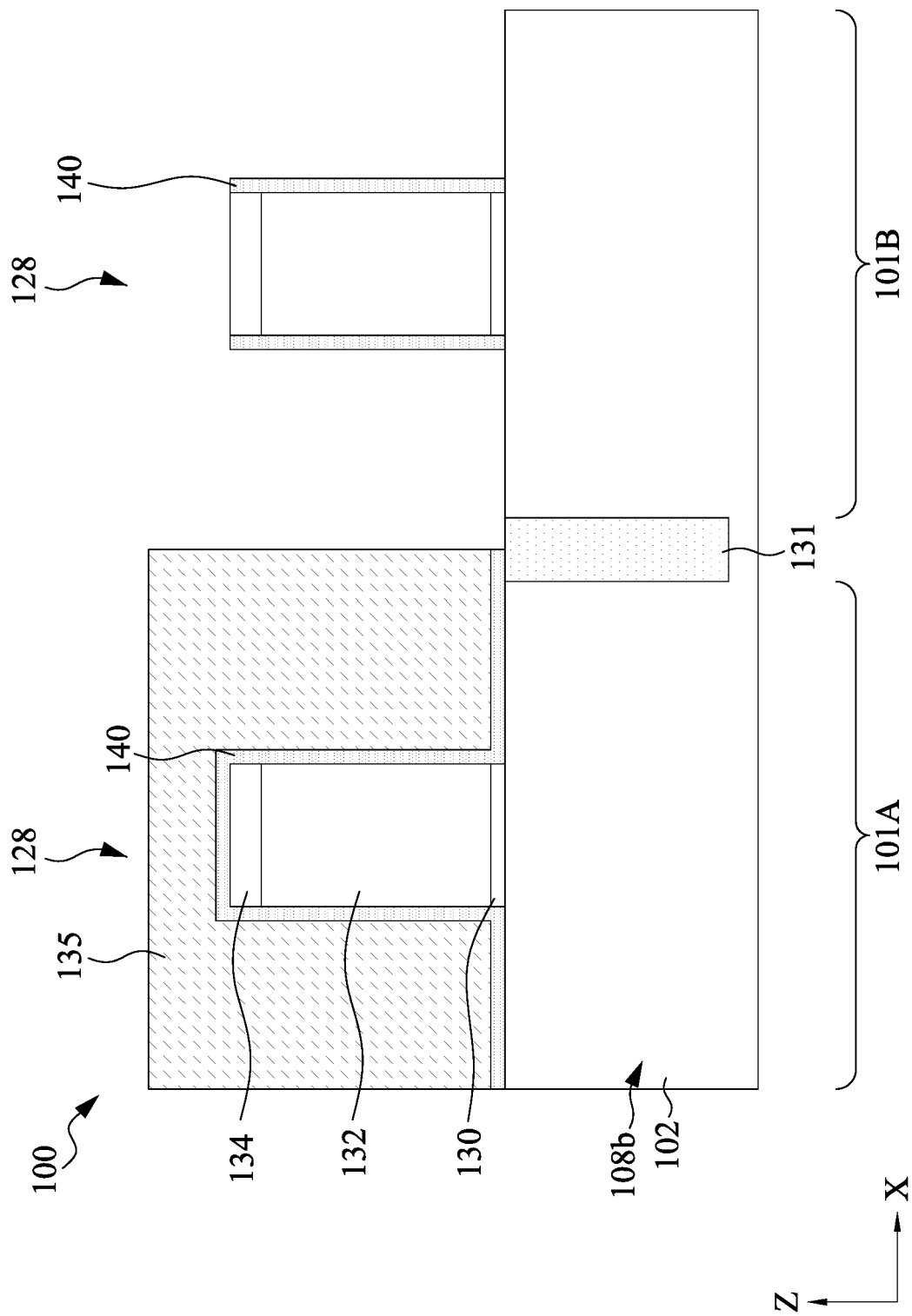

In FIG. 5, portions of the gate spacers 140 at the region 101B are removed. A patterned mask layer 135 may be first formed on the sacrificial gate stacks 128 and the fins 108a, 108b at the region 101A, and the sacrificial gate stacks 128 and the fins 108a, 108b at the region 101B may be exposed. The patterned mask layer 135 may be a photoresist or the like. A removal process, such as an anisotropic etch process, may be performed on the exposed gate spacer 140 at the region 101B. During the anisotropic etch process, most of the gate spacer 140 is removed from horizontal surfaces, such as tops of the sacrificial gate stacks 128, tops of the fins 108a, 108b, and tops of the isolation region 131 at the region 101B, leaving the gate spacer 140 on the vertical surfaces, such as on opposite sidewalls of the sacrificial gate stacks 128. It is contemplated that the order of the processes discussed herein are illustrative. Depending on the application, the patterned mask layer 135 may be first formed at the region 101B (i.e., PMOS regions are covered) and the removal process is performed on the exposed gate spacer 140 at the region 101A.

Figure 6:
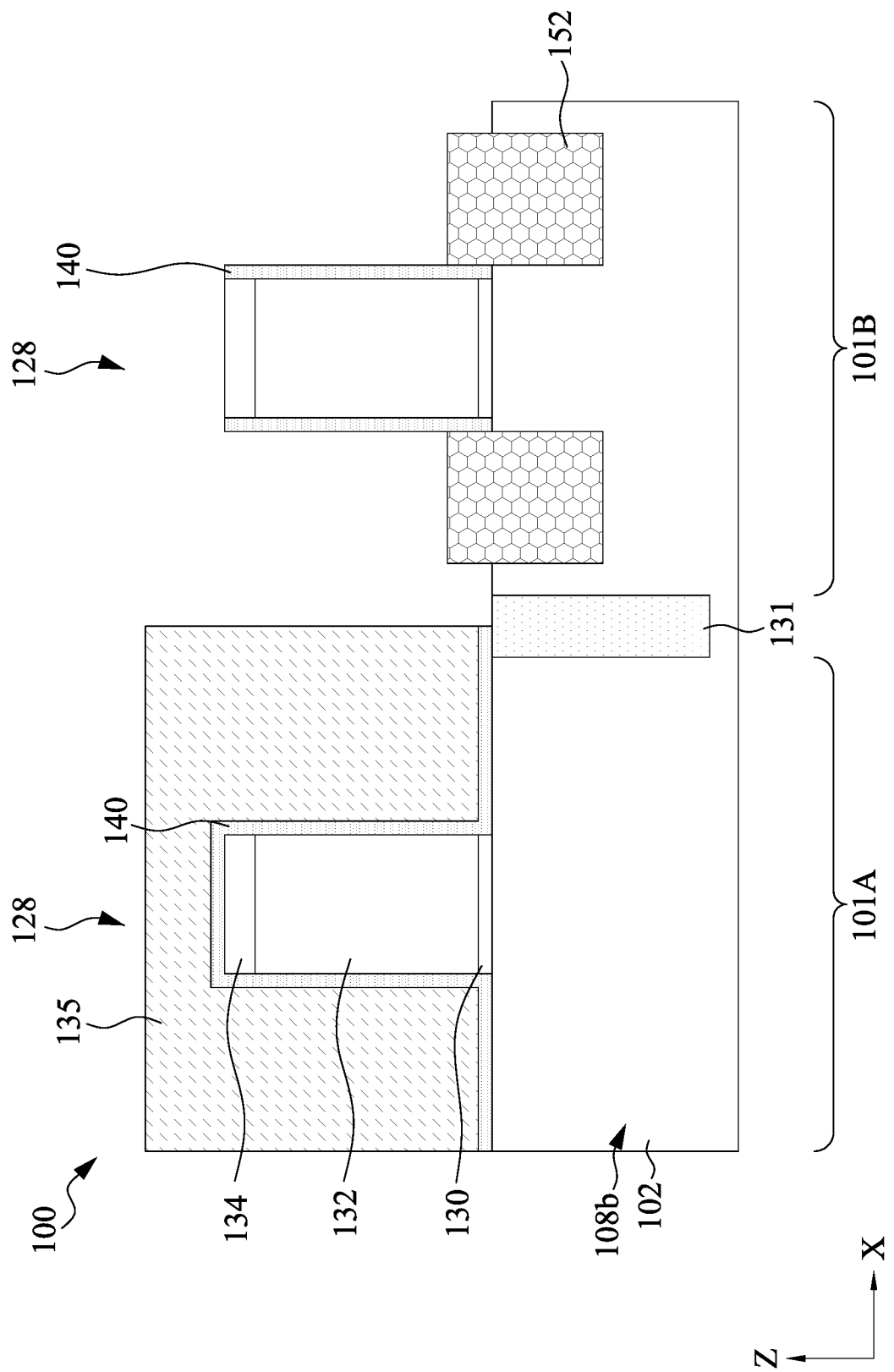

In FIG. 6, portions of the fins 108a, 108b at the region 101B not covered by the sacrificial gate stacks 128 and the gate spacers 140 are recessed. The recess of the portions of the fins 108a, 108b can be done by an etch process, either isotropic or anisotropic etch process. The etch process does not substantially affect the mask layer and the sacrificial gate stacks 128 at the region 101A. The etch process may be a dry etch, such as a RIE, NBE, or the like, or a wet etch, such as using tetramethyalammonium hydroxide (TMAH), ammonium hydroxide (NH$_4$OH), or any suitable etchant. The fins 108a, 108b are recessed so that the tops of the fins 108a, 108b is at a level below the top surface of the insulating material 112. Trenches are formed in the fins 108a, 108b as the result of the recess of the portions of the fins 108a, 108b.

Next, source/drain (S/D) epitaxial features 152 are formed in the trenches. In cases where the region 101B is a PMOS region, each S/D epitaxial feature 152 may include one or more layers of Si, SiGe, SiGeB, Ge, or a group III-V material (InSb, GaSb, InGaSb). In some embodiments, the S/D epitaxial features 152 in the region 101B are Si. In some embodiments, the S/D epitaxial features 152 in the region 101B are SiGe. Each S/D epitaxial feature 152 may include P-type dopants, such as boron (B) or other suitable P-type dopants. The S/D epitaxial features 152 may be formed by any suitable method, such as CVD, CVD epitaxy, MBE, or other suitable method. The S/D epitaxial features 152 may grow both vertically and horizontally to form facets, which may correspond to crystalline planes of the material used for the substrate 102. The S/D epitaxial features 152 may each have a top surface at a level higher than the tops of the fins 108a, 108b.

Figure 7:
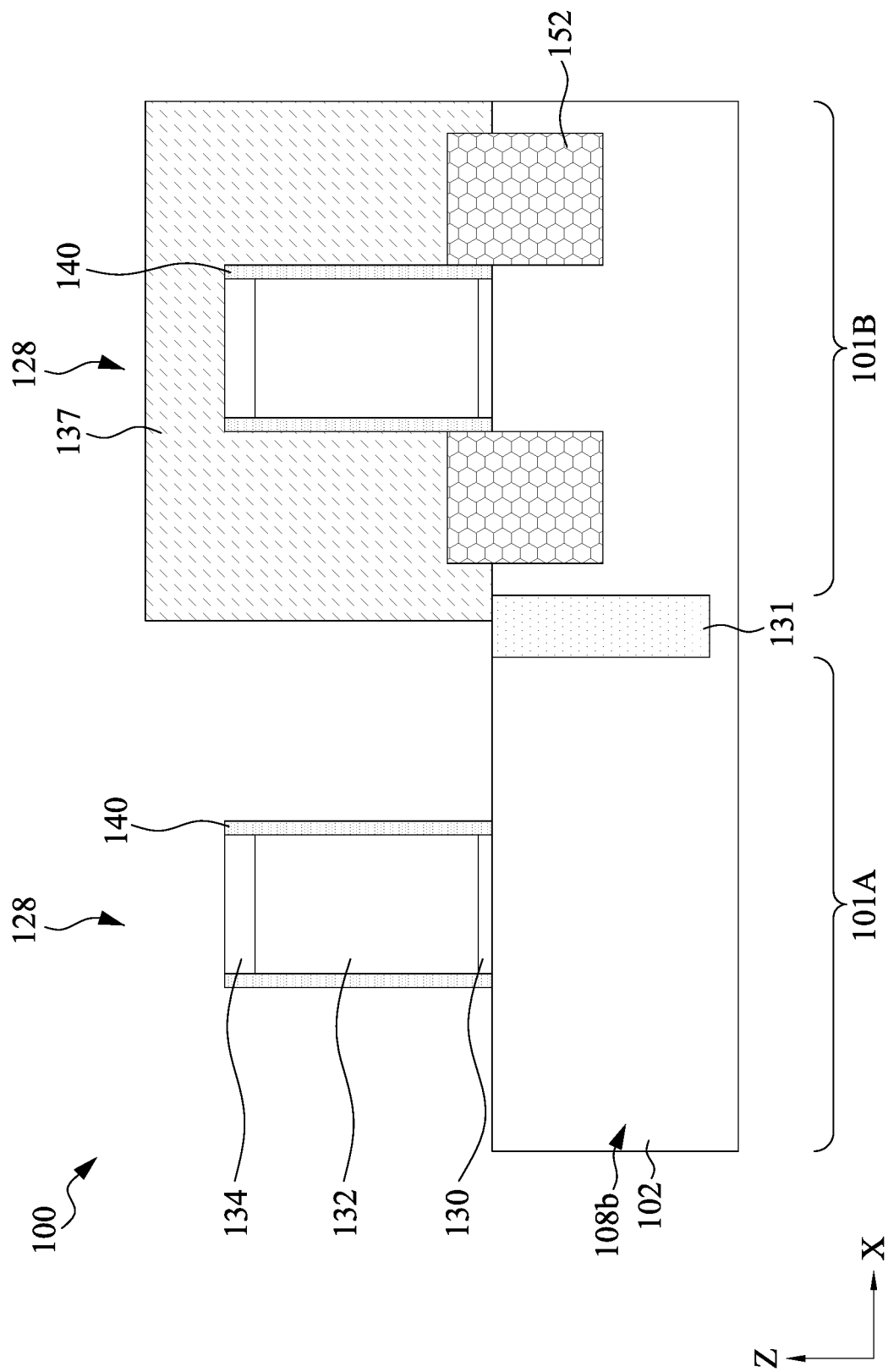

In FIG. 7, a patterned mask layer 137, such as a photoresist or the like, is formed on the sacrificial gate stacks 128, the S/D epitaxial features 152, and the fins 108a, 108b at the region 101B, and the sacrificial gate stacks 128 and the fins 108a, 108b at the region 101A are exposed. The patterned mask layer 137 is used to define where the subsequent amorphized regions 141 (FIG. 8) are formed and to protect region 101B from implantation damage. A removal process, such as an anisotropic etch process, is then performed on the exposed gate spacer 140 at the region 101A. During the anisotropic etch process, most of the gate spacer 140 is removed from horizontal surfaces, such as tops of the sacrificial gate stacks 128, tops of the fins 108a, 108b, and tops of the isolation region 131 at the region 101A, leaving the gate spacer 140 on the vertical surfaces, such as on opposite sidewalls of the sacrificial gate stacks 128.

Figure 8:
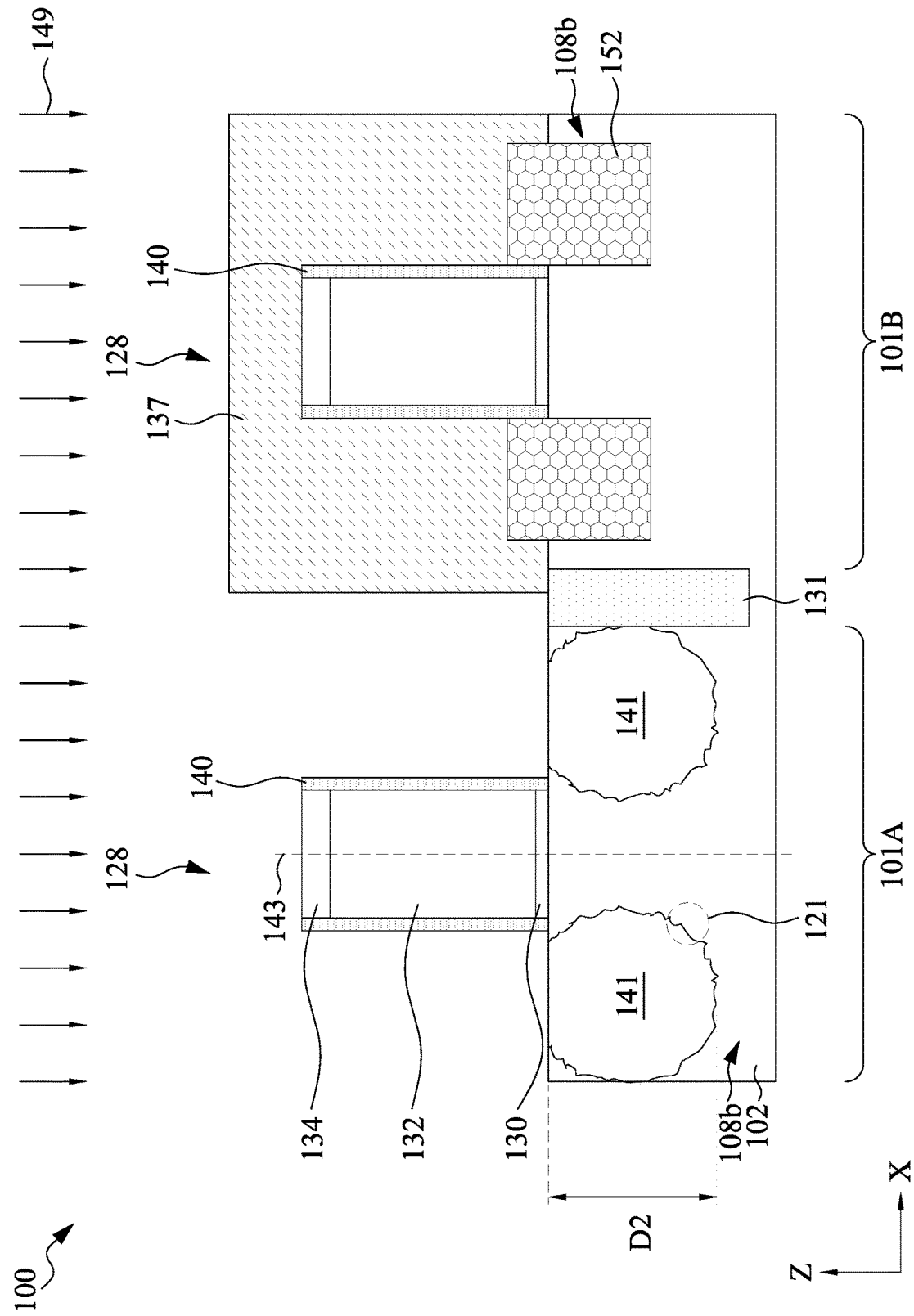

In FIG. 8, a pre-amorphous implantation (PAI) process 139 is performed on the exposed fins 108a, 108b at the region 101A not covered by the sacrificial gate stacks 128 and the gate spacers 140. The PAI process 139 implants the fins 108a, 108b with ion species, which damage the lattice structure of the fins 108a, 108b and form amorphized regions 141. The amorphized regions 141 are located at positions corresponding to source and drain regions of a transistor device. In some embodiments, the implanted ions species may scatter in the fins 108a, 108b. The implanted ion species cause lateral amorphization, which results in amorphized regions 141 extending to regions shadowed by the gate spacers 140. The amorphized regions 141 are formed in a source and drain region (i.e., regions on opposing sides of the sacrificial gate stacks 128 at region 101A) and does not extend beyond the center line 143 of the sacrificial gate stack 128. The amorphized region 141 has an amorphized depth D2 measuring from a top surface of the fins 108a, 108b to a bottom of the amorphized region 141. The amorphized depth D2 is formed according to design specifications and may be adjusted by controlling the implant energy, implant dosage, and implant species, etc. The amorphized depth D2 can also be controlled by the thickness of the gate spacers 140. This is because the gate spacers 140 serve to concentrate the PAI process 139 implantation energy away from the center line 143 of the sacrificial gate stack 128, thereby allowing for a deeper amorphized depth D2. In various embodiments, the depth D2 is in a range of about 10 nm to about 100 nm, for example about 15 nm to about 35 nm.

In some embodiments, the PAI process 139 implants the exposed fins 108a, 108b with silicon (Si) or germanium (Ge). Other implant ions heavier than silicon may also be used. For example, in some embodiments, the PAI process 139 utilizes implant species such as Ar, Xe, BF$_2$, As, In, or the like, or combinations thereof. The PAI process 139 may implant the ion species at a kinetic energy in a range of about 10 KeV to about 60 KeV, such as about 20 KeV to about 45 KeV, and an implant dosage in a range of about $1E10^{14}$ atoms/cm$^2$ to about $2E10^{15}$ atoms/cm$^2$, which may vary depending on the implantation temperature. Lower implantation temperature enhances implant amorphization efficiency. In some embodiments, the implant temperature is in a range of about 10 degrees Celsius to about 85 degrees Celsius. In one exemplary embodiment, the PAI process 139 is performed to implant Ge ion species at a kinetic energy of about 30 KeV and at an implant temperature of about 60 degrees Celsius.

Figure 9:
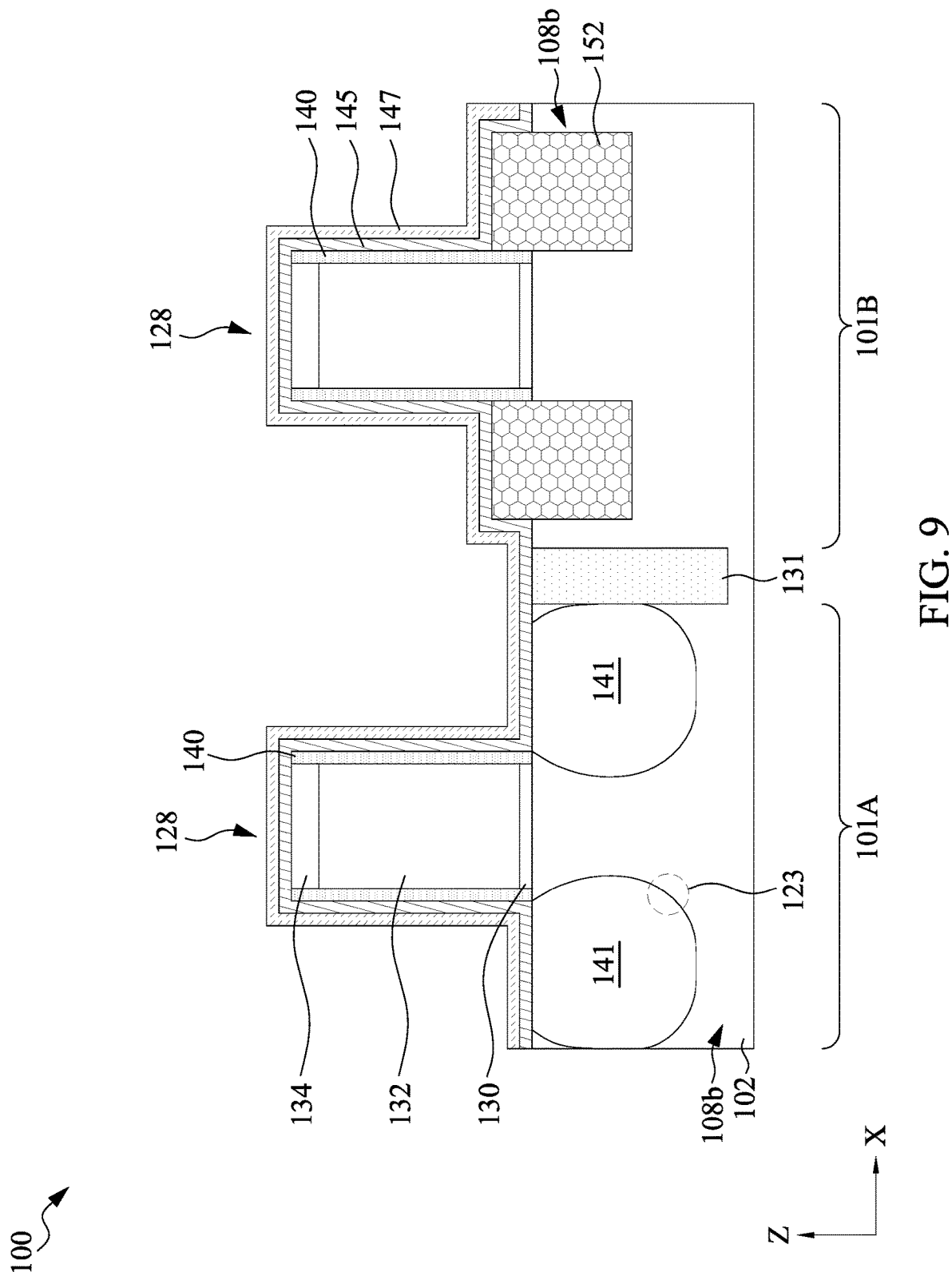

In FIG. 9, after the amorphized regions 141 are formed, the patterned mask layer 137 is removed. The patterned mask layer 137 may be removed using any suitable process such as ashing or etching process. An oxide layer 145 is conformally formed on exposed surfaces of the semiconductor device structure 100. The oxide layer 145 is deposited on the exposed surfaces of the fins 108a, 108b, the S/D epitaxial features 152, and the sacrificial gate stacks 128 at the region 101B, the isolation region 131, and the amorphized regions 141 and the sacrificial gate stacks 128 at the region 101A. The oxide layer 145 serves to provide etch selectivity with respect to the subsequent stressor layer 147 so that the underlying layers (e.g., sacrificial gate stacks 128 and S/D epitaxial features 152) are not damaged during removal of the stressor layer 147. The oxide layer 145 may include or be made of silicon oxide, silicon oxynitride, or the like, and may be formed by CVD, PECVD, ALD, or any suitable deposition technique. The oxide layer 145 may have a thickness of about 1 Angstrom to about 20 Angstroms, for example about 10 Angstroms.

Next, a stressor layer 147 is formed on the oxide layer 145. The stressor layer 147 serves to provide stress in the amorphized regions 141. The stressor layer 147 may include or be made of silicon nitride, silicon oxide, silicon carbide, silicon oxynitride, oxynitride, oxide, titanium nitride, silicon germanium, boron carbide, and/or any combinations thereof. In one embodiment, the stressor layer 147 is silicon nitride, which may or may not contain carbon. In another embodiment, the stressor layer 147 is silicon carbide. In yet another embodiment, the stressor layer 147 is boron carbide. In some embodiments, the stressor layer 147 is a bi-layer stack comprising silicon nitride and silicon carbide. In some embodiments, the stressor layer 147 is a bi-layer stack comprising silicon carbide and boron carbide. In some embodiments, the stressor layer 147 is a bi-layer stack comprising silicon nitride and boron carbide. The stressor layer 147 is formed with an inherent tensile stress. The tensile stress affects the subsequent recrystallization process. As will be discussed in more detail below, the tensile stress of the stressor layer 147 imparts stress in the amorphized regions 141 during the subsequent annealing process so that regrowth rates on different crystal planes are substantially the same. Therefore, crystallographic defects, such as dislocations, can be formed symmetrically and uniformly in the source and drain regions. The uniform dislocations strain crystalline lattice of the subsequently formed S/D epitaxial features at the region 101A. As a result, uniform channel stress is obtained and carrier mobility for the NMOS devices is improved.

The stressor layer 147 is a highly conformal layer (e.g., a total thickness variation is less than about 5%) formed by thermal ALD, PEALD, CVD, PVD, HDPCVD, plating, or any suitable deposition technique. The stressor layer 147 has a thickness in a range of about 80 Angstroms to about 400 Angstroms, for example about 100 Angstroms to about 200 Angstroms. In some embodiments, the oxide layer 145 has a thickness T1 and the stressor layer 147 has a thickness T2, and a ratio of the thickness T1 and T2 is about 1:8 to about 1:20, for example about 1:13. In one embodiment, the deposited stressor layer 147 is a dielectric film having Si—N bonds formed by PEALD process. An exemplary PEALD process for forming silicon nitride may include following operations: (a) providing the semiconductor device structure 100 in a reaction chamber; (b) introducing a silicon-containing precursor into the reaction chamber so that a monolayer of silicon or silicon-containing substance is adsorbed on the surface of the oxide layer 145; (c) removing excess silicon-containing precursor and reaction byproducts from the reaction chamber; (d) introducing nitrogen-containing precursor into the reaction chamber; (e) generating reactive substance from the nitrogen-containing precursor and expose the adsorbed silicon or silicon-containing substance to the reactive substance to convert the adsorbed silicon or silicon-containing substance into silicon nitride; (f) removing nitrogen atoms, plasma, or free radicals and reaction by-products from the reaction chamber. A deposition cycle may include operations (b) to (f) and can be repeated until a silicon nitride layer with a predetermined thickness is formed. A flow of carrier gas (e.g., helium or the like) may be provided along with the silicon-containing precursor. The removal of the precursors and reaction byproducts may be performed by stopping the flow of the precursor while allowing the carrier gas or purge gas (e.g., nitrogen or argon) to continue to flow. In some embodiments, the excess precursor may be purged by means of an inert gas (e.g., nitrogen) flowing throughout the deposition cycle. It is contemplated that the order of the silicon-containing precursor and nitrogen-containing precursor can be changed, and the deposition cycle can start from any precursor. In addition, the silicon-containing precursor and nitrogen-containing precursor can be overlapped or combined. For example, the silicon-containing precursor and the nitrogen-containing precursor can be provided simultaneously in partially or completely overlapping pulses. The term "pulse" can be understood to include introducing reactants into the reaction chamber for a predetermined amount of time and therefore can be any time length.

Suitable gases for the silicon-containing precursor may include, but are not limited to, silane ($SiH_4$), dichlorosilane ($SiH_2Cl_2$, DCS), trichlorosilane ($SiHCl_3$, TCS), silicon tetrachloride ($SiCl_4$, STC), hexachlorosilane ($Si_2Cl_6$), or combinations thereof. Other gases comprising Si, N, H, and optionally C in its molecule, may also be used. In some embodiments, the nitrogen-containing precursor is introduced into the reaction chamber in excited state. In some embodiments, the nitrogen-containing precursor may be or include nitrogen radicals, nitrogen atoms and/or nitrogen plasma. Suitable gases for the nitrogen-containing precursor may include, but are not limited to, nitrogen ($N_2$), ammonia ($NH_3$), hydrazine ($N_2H_4$), nitrous oxide ($N_2O$), or the like, or combinations thereof. In some embodiments, the nitrogen-containing precursor may continue to flow throughout the deposition process and is only activated intermittently. The reactive substance may be generated from rare gases (e.g., Ar or He) in-situ in the reaction chamber or in the upstream of the reaction chamber (e.g., from a remote plasma generator). In some embodiments, the reactive substance is or includes hydrogen plasma, hydrogen radicals, or atomic hydrogen.

In various embodiments, the flow of the silicon-containing precursor and the flow of the nitrogen-containing precursor may be at a ratio of about 1:1 to about 1:20, such as about 1:2 to about 1:4, for example about 1:3. The flow of the nitrogen-containing precursor and the flow of the purge gas (or inner gas) may be at a ratio of about 1:20 to about 1:400, such as about 1:40 to about 1:200, for example about 1:50. The flow of the silicon-containing precursor may be in a range of about 0.5-5 standard liter per minute (SLM). The flow of the nitrogen-containing precursor may be in a range of about 2-10 SLM. The flow of the purge gas may be in a range of about 100-400 SLM. During the deposition process, the temperature of the substrate may be maintained at a range of about 350-550 degrees Celsius. The pressure of the reaction chamber may be maintained at about 1-20 Torr. The duration of each deposition cycle may be about 60 seconds to about 120 seconds, for example about 90 seconds. The purge time may be about 5 seconds to about 15 seconds, for example about 10 seconds. The supply time of the silicon-containing precursor may be about 15 seconds to about 40 seconds, for example about 30 seconds. The supply time of the nitrogen-containing precursor may be about 10 seconds to about 30 seconds, for example about 20 seconds. In cases where RF power is applied during the deposition process, the RF power may be about 50 W to about 300 W operated at a frequency of 13.56 MHz. The deposited stressor layer 147 has hydrogen content of about 10 atomic % or less, such as about 5% or less, for example about 1% to about 4%.

In some embodiments, the stressor layer 147 is formed by an ALD-based process (e.g., PEALD) performing at a temperature of about 550 degrees Celsius or below, for example about 450 degrees Celsius or below, such as about 350 degrees Celsius to about 400 degrees Celsius. Lower temperature prevents loss of the hydrogen in the stressor layer 147, which may otherwise affect the tensile stress to be exerted to the crystalline regions 151 (FIG. 10) during the subsequent annealing process. Particularly, the entire ALD-based process is performed for at least 3 hours or longer, for example at least about 4 hours or longer. In one embodiment, the stressor layer 147 is formed by PEALD process at a temperature of about 400 degrees Celsius for about 4.5 hours. It has been observed that the amorphized regions 141 may have a rough, substantial round profile after the PAI process 139, and the amorphous-crystalline interface is irregular due to the damage induced by the PAI process 139. In one example shown in FIG. 8, the amorphous-crystalline interface, such as the interface at region 121, has a first roughness after the PAI process 139. The PAI induced roughness could result in and non-uniform dislocations during the subsequent recrystallization process. Forming the stressor layer 147 with ALD-based process for a duration of 4 hours or longer is advantageous over CVD-based processes (e.g., PECVD or CVD) because the stressor layer deposited with CVD-based deposition process has a much faster deposition rate and therefore, the deposited stressor layer may be formed with unstable film stress and the amorphous-crystalline interface may not have enough time to restore to a smooth profile, resulting in undesirable silicon regrowth from rough and uneven amorphous-crystalline interfaces in a non-uniform manner. As a result, crystallographic defects (e.g., dislocations) are formed with non-uniform depths or even missing in some cases. In contrast, low temperature, long processing time of the ALD-based process ensures rough and uneven amorphous-crystalline interface of the amorphized regions 141 are recrystallized or recovered by thermal energy during formation of the stressor layer 147. Therefore, a smooth amorphous-crystalline interface can be obtained prior to the subsequent recrystallization process. In some embodiments, the amorphized regions 141 are converted to have a substantial square profile after the formation of the stressor layer 147. In one example shown in FIG. 9, the amorphous-crystalline interface, such as the interface at region 123, has a second roughness that is less than the first roughness. In some embodiments, the second roughness and the first roughness are at a ratio of about 1:8 to about 1:50, such as about 1:10 to about 1:30, for example about 1:20. The term "roughness" discussed herein refers to arithmetic average of the absolute values of the profile height deviations from the mean line, recorded within the evaluation length. A smooth amorphous-crystalline interface improves the uniformity of the dislocations to be formed in the amorphized regions 141.

Example

In one exemplary embodiment, the stressor layer 147 was formed on the oxide layer 145 in a reaction chamber using the PEALD process discussed above. Examples of the process conditions are shown below.

| | |
|---|---|
| DCS (standard liter per minute, SLM) | 3 |
| NH$_3$ (SLM) | 6 |
| N$_2$ (SLM) | 250 |
| Substrate temperature (° C.) | 450 |
| RF power (W) | 150 (at a frequency of 13.56 MHz) |
| Pressure (Torr) | 10 |
| Duration of each cycle (seconds) | 90 |
| Processing time (hour) | 3 |
| Purge time (second) | 10 |
| DCS supply time (second) | 30 |
| NH$_3$ supply time (second) | 20 |

Figure 10:
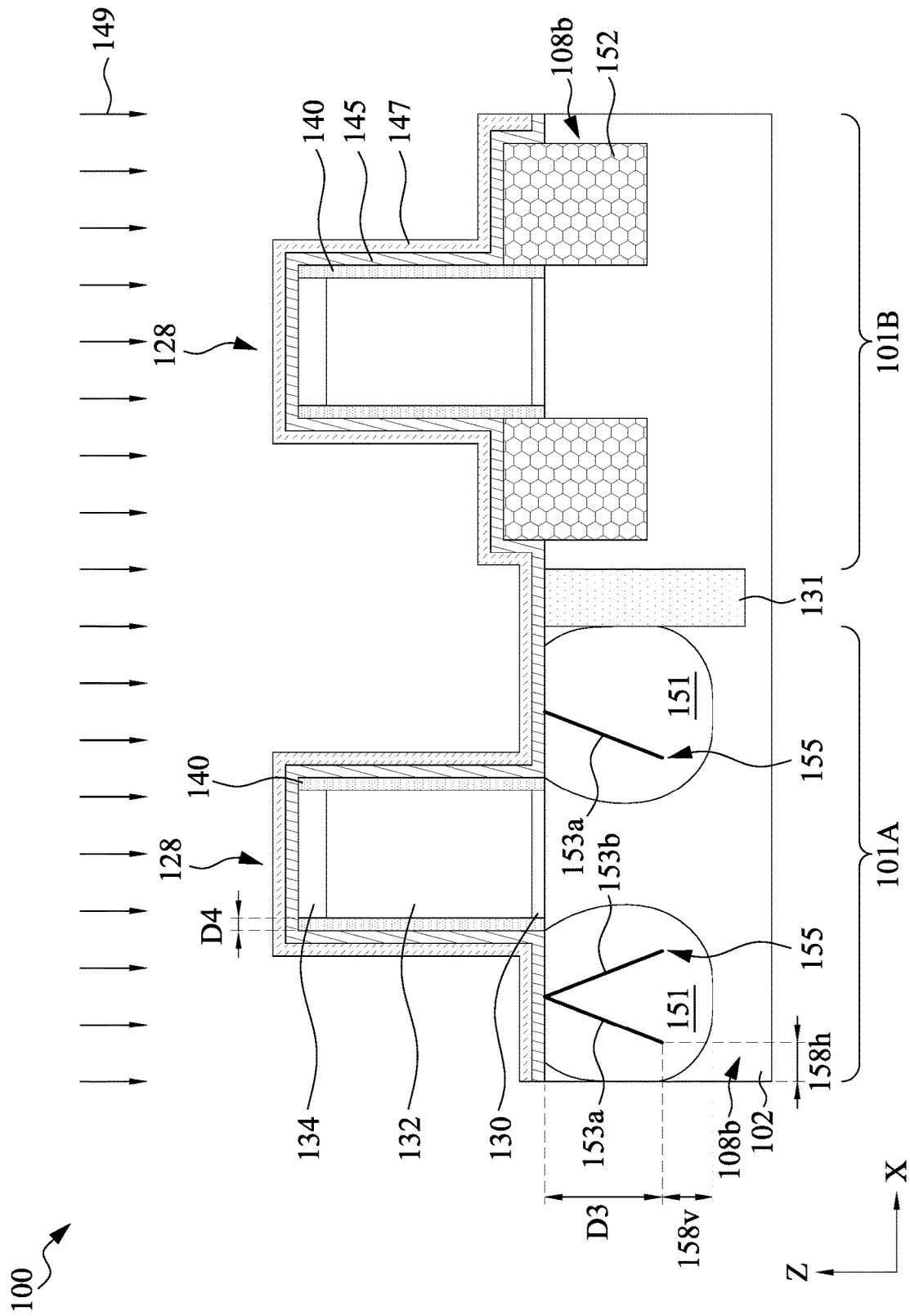

In FIG. 10, after the stressor layer 147 is formed on the oxide layer 145, an annealing process 149 is performed on the semiconductor device structure 100. The annealing process 149 causes the amorphized regions 141 to re-crystallize. The annealing process 149 may be any suitable thermal process such as a rapid thermal annealing (RTA) process, a millisecond thermal annealing (MSA) process, a microsecond thermal annealing (μSA) process, a laser anneal process, or other anneal processes. In some embodiments, the annealing process 149 is performed using spike RTA, which heats the semiconductor device structure 100 to an annealing temperature between about 900 degrees Celsius and about 1100 degrees Celsius for a duration of about 1 second to about 10 seconds. The annealing process 149 may include a preheat stage which heats the semiconductor device structure 100 at a temperature in a range from about 400 degrees Celsius to about 620 degrees Celsius for a duration of about 20 seconds to about 80 seconds. After the annealing process 149, the semiconductor device structure 100 is cooled down. As a result of the annealing process 151, the amorphized regions 141 are recrystallized to form crystalline regions 151 with a memorized stress obtained from the stressor layer 147. The growth rate on surfaces having (100) plane is usually higher than the growth rate on surfaces having (110) plane. During the recrystallization, the stable film stress from the stressor layer 147 retards the regrowth rate of the amorphized region having (100) plane, allowing uniform regrowth rate of the amorphized regions 141 on different crystal planes (i.e., growth rate on (100) and (110) planes are substantially the same).

During the annealing process 149, dislocations 153a, 153b are formed in the crystalline regions 151 as the amorphized regions 141 recrystallizes. The recrystallization starts at the interface between the amorphized regions 141 and the silicon substrate 102. The dislocations 153a, 153b are formed when the recrystallized bottom portion (having crystal plane (100)) of the amorphized regions 141 merges with the recrystallized side portion (having crystal plane (110)) of the amorphized regions 141. Therefore, the dislocations 153a, 153b extend along dislocation planes tilting in opposite directions. The dislocations 153a, 153b are substantially symmetric and the angle between dislocation planes may be in a range of about 20 degrees to about 65 degrees, for example about 40 degrees to about 50 degrees. In some embodiments, the dislocations 153a, 153b start forming at pinchoff points 155, which are in the crystalline regions 151 at a depth D3 measuring from the top surface of the fins 108a, 108b. The depth D3 may be in a range of about 5 nm to about 80 nm, for example about 20 nm to about 30 nm. The deeper the depth D3, the lower the stress is to be created in the channel region. In some embodiments, the dislocations 153a, 153b are formed with consistent depth D3 in all devices at the region 101A. The distance D4 between the dislocations 153a, 153b and the immediately adjacent sacrificial gate stack 128 also affects the channel stress. The greater the distance D4, the lower the stress is to be created in the channel region. In some embodiments, the distance D4 is less than about 10 nm, such as about 7 nm or below, for example about −2 nm to about 5 nm.

The pinchoff points 155 are formed according to design specifications and are a function of the annealing process 149. In some embodiments, the annealing process 149 is performed (e.g., by controlling the temperature of the preheat stage) such that the pinchoff points 155 are not formed within the channel region (e.g., fins 108a, 108b below the sacrificial gate stacks 128). In some embodiments, the pinchoff points 155 have a horizontal buffer 158h of about 1 nm to about 10 nm, for example about 2 nm to about 5 nm, and a vertical buffer 158v of about 1 nm to about 20 nm, for example about 3 nm to about 10 nm. In some cases where the isolation region 131 is being too close or in contact with portion of the crystalline regions 151, there may be a single dislocation (e.g., 153a) formed in the crystalline region 151 that is in contact with the isolation region 131, as shown in FIG. 10.

Figure 11:
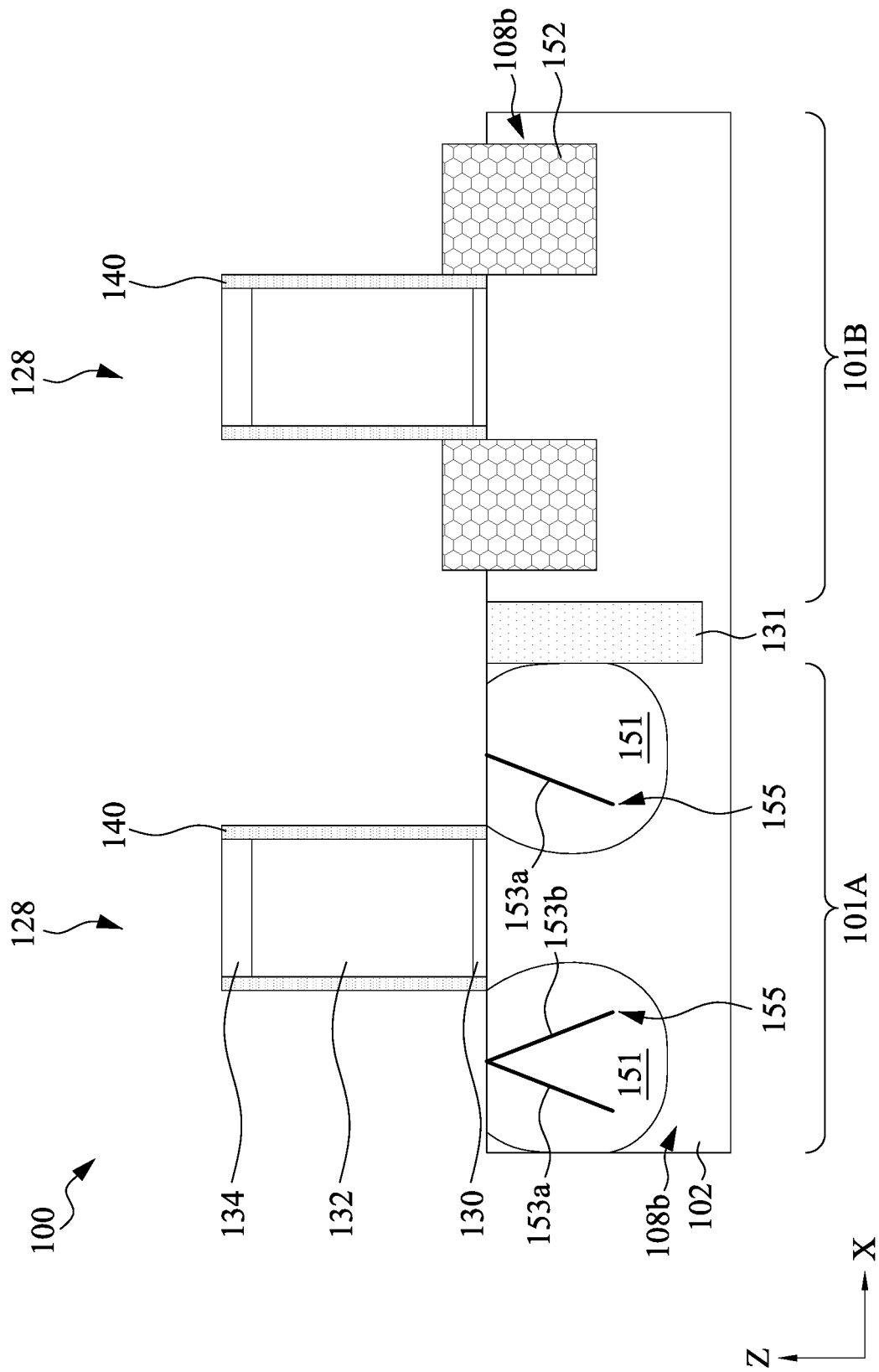

In FIG. 11, the stressor layer 147 and the oxide layer 145 are removed. The stressor layer 147 and the oxide layer 145 may be removed by one or more etch processes, which can be a dry etch, wet etch, or a combination thereof. Since the crystalline regions 151 memorize the stress induced by the stressor layer 147, the crystalline regions 151 maintain their stressed lattice configurations when the stressor layer 147 is removed.

Figure 12:
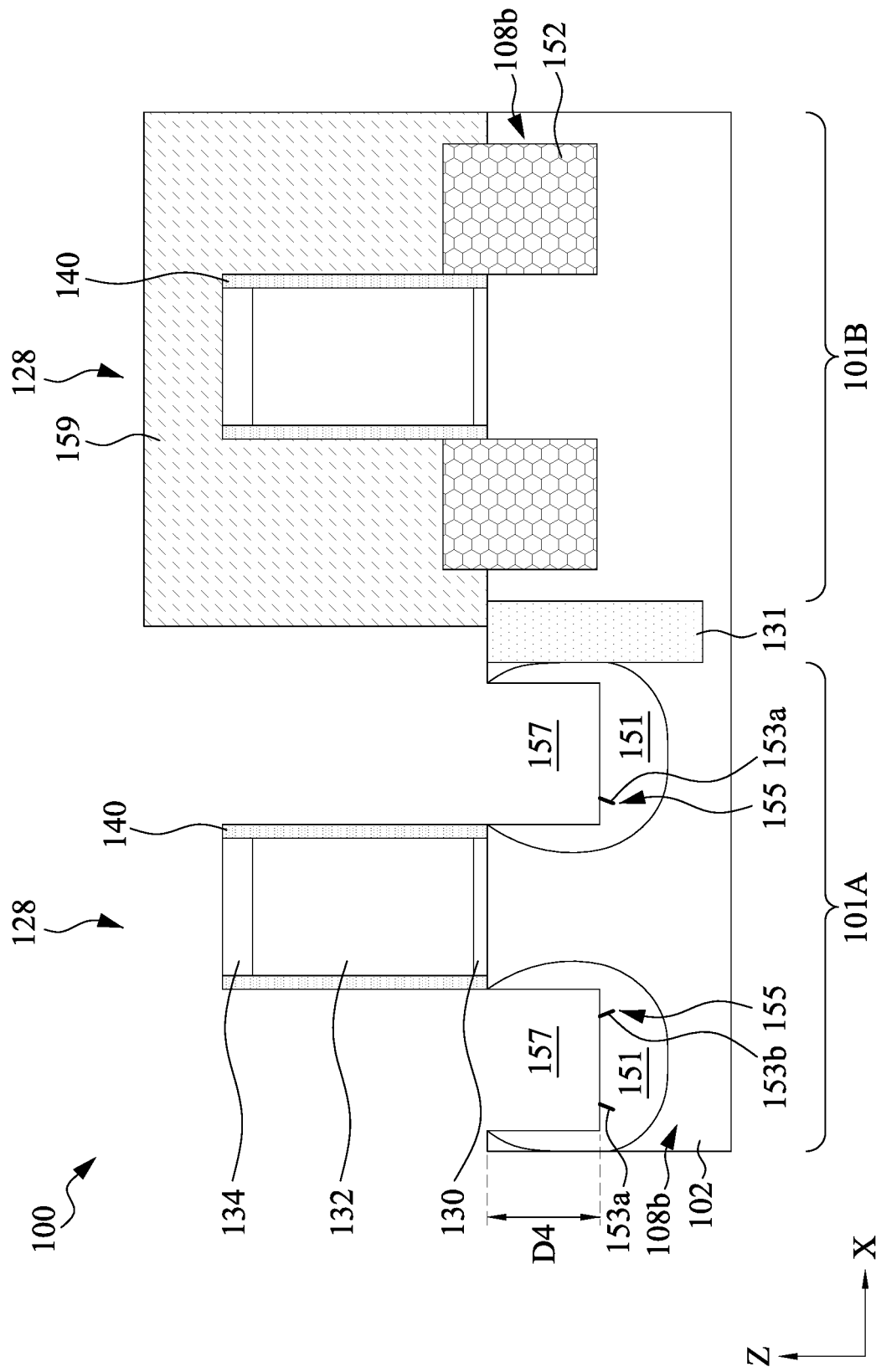

In FIG. 12, the portions of the crystalline regions 151 are removed to form trenches 157. A patterned mask layer 159, such as the patterned mask layer 137, may be deposited on the sacrificial gate stacks 128, the S/D epitaxial features 152, and the fins 108a, 108b at the region 101B, while the sacrificial gate stacks 128 and the crystalline regions 151 at the region 101A are exposed. The removal of the portion of the crystalline regions 151 may be performed by an etch process, which may be a dry etch, wet etch, or a combination thereof. The etch process selectively removes portions of the recrystallized silicon in the crystalline regions 151 but not the sacrificial gate stacks 128 and gate spacers 140. The trenches 157 may have a depth D5 that is shorter than the depth D2 (FIG. 8). In some embodiments, the depth D5 is in a range of about 2 nm to about 60 nm, for example about 5 nm to about 20 nm. The etch process may remove portions of the dislocations 153a, 153b. In some embodiments, the removal of the portion of the crystalline regions 151 is performed so that a portion of the dislocations 153a, 153b remains in the crystalline regions 151. The remaining dislocations 153a, 153b serve as seeds for forming dislocations in the subsequent S/D epitaxial features (S/D epitaxial features 154 in FIG. 13) to be formed in the trenches 157.

Figure 13:
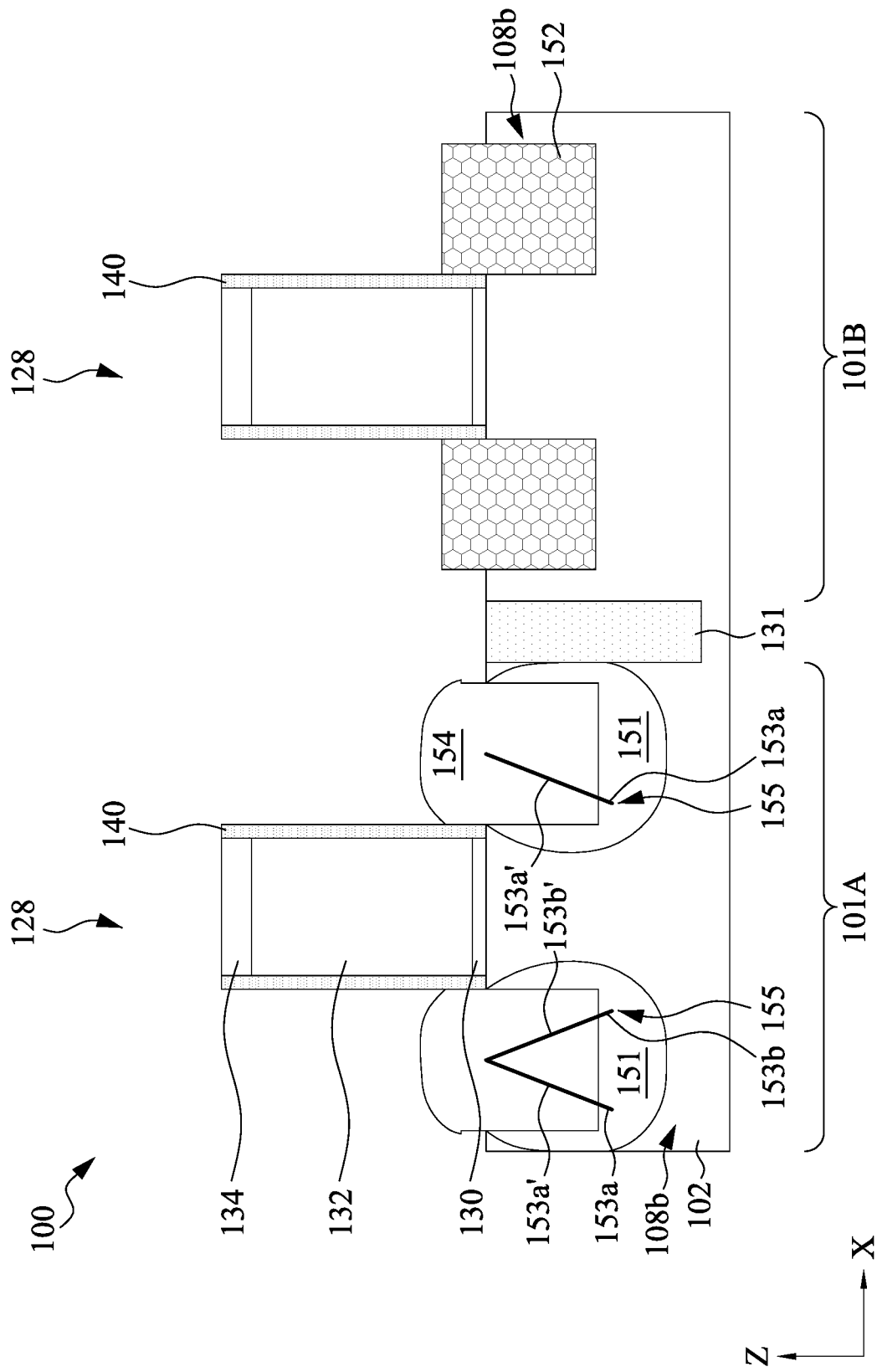

In FIG. 13, the patterned mask layer 159 is removed and source/drain (S/D) epitaxial features 154 are formed in the trenches 157 (FIG. 12). Alternatively, the S/D epitaxial features 154 may be formed in the trenches 157 prior to removing the patterned mask layer 159. The patterned mask layer 159 may be removed using any suitable process such as ashing or etching process. In cases where the region 101A is a NMOS region, each S/D epitaxial feature 154 may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 154 may each have a top surface at a level higher than the tops of the fins 108a, 108b. In some embodiments, the S/D epitaxial features 154 are formed with dislocations 153a', 153b', which are developed from the dislocations 153a, 153b in the crystalline regions 151 and extend into the S/D epitaxial features 154. The dislocations 153a', 153b' exert tensile stress in the S/D epitaxial features 152 which enhances carrier mobility in the channel region and thus device performance for the NMOS devices at the region 101A.

Figure 14:
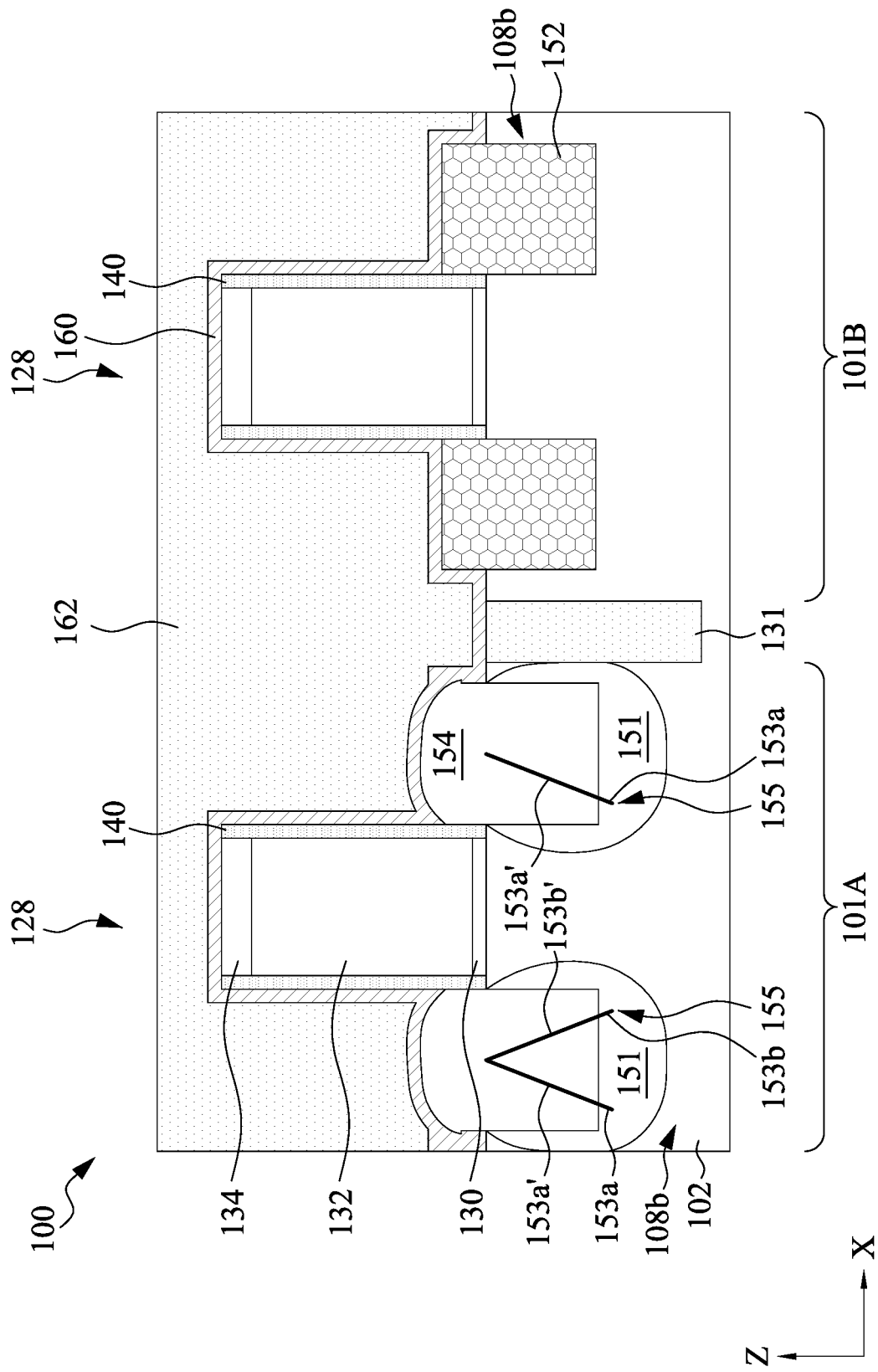

In FIG. 14, a contact etch stop layer (CESL) 160 is conformally formed on the exposed surfaces of the semiconductor device structure 100. The CESL 160 covers the sidewalls of the sacrificial gate stacks 128, the insulating material 112, the S/D epitaxial features 152, 154, and the isolation region 131. In some embodiments, the CESL 160 is also in contact with a portion of the crystalline region 151. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the ILD layer 164 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The ILD layer 162 may be deposited by a PECVD process or other suitable deposition technique. In some embodiments, after formation of the ILD layer 162, the semiconductor device structure 100 may be subject to a thermal process to anneal the ILD layer 162.

Figure 15:
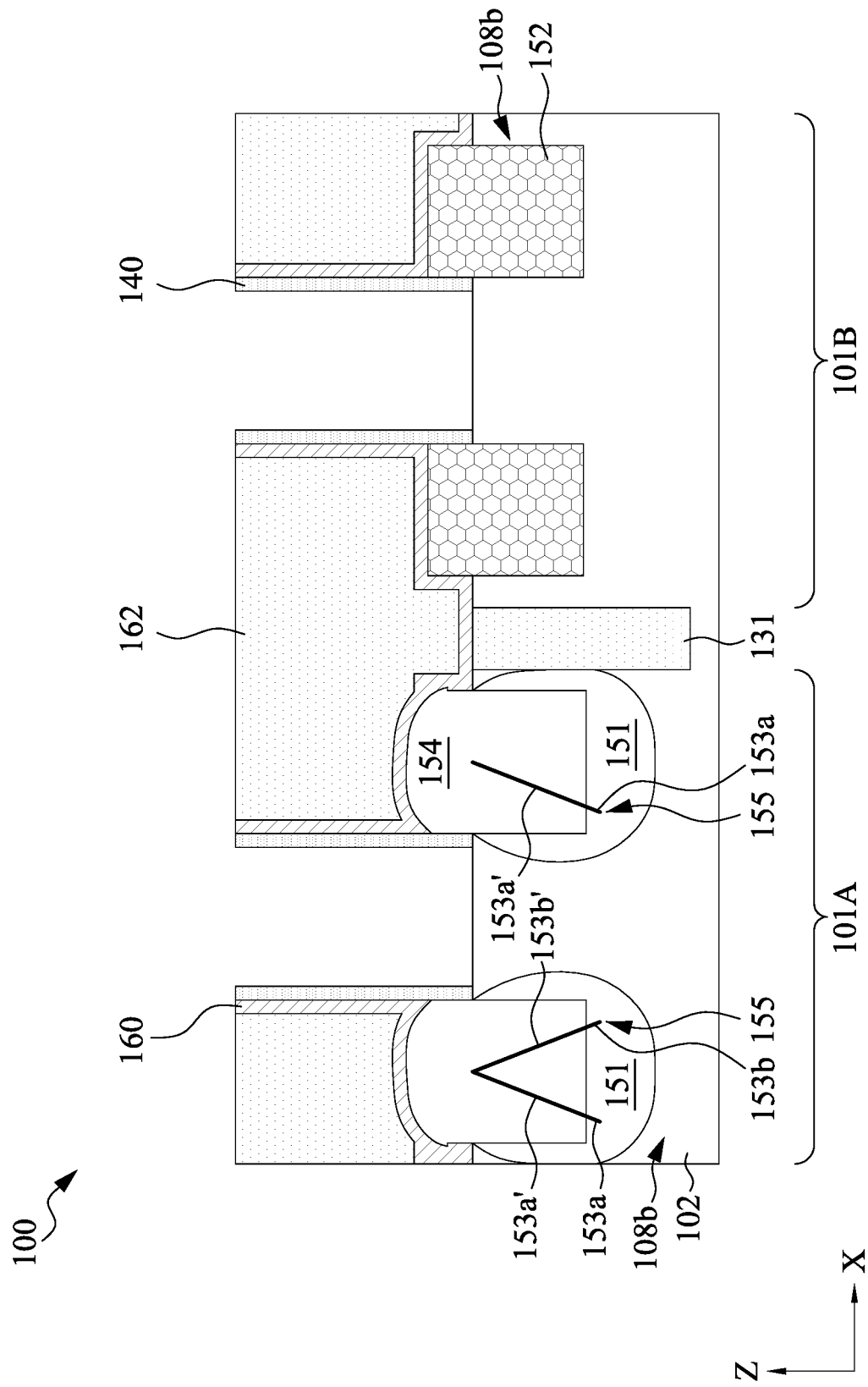

In FIG. 15, after formation of the ILD 162, a planarization process, such as a CMP process, is performed to expose the sacrificial gate electrode layer 132 (FIG. 14). The planarization process removes portions of the ILD layer 162 and the CESL 160 disposed on the sacrificial gate stacks 128. The planarization process may also remove the mask structure 134. Next, the mask structure 134 (if not removed during CMP process), the sacrificial gate electrode layers 132 (FIG. 14), and the sacrificial gate dielectric layers 130 (FIG. 14) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the ILD layer 162. The removal of the sacrificial gate electrode layers 132 and the sacrificial gate dielectric layers 130 exposes a top portion of the fins 108a, 108b in the channel region.

Figure 16:
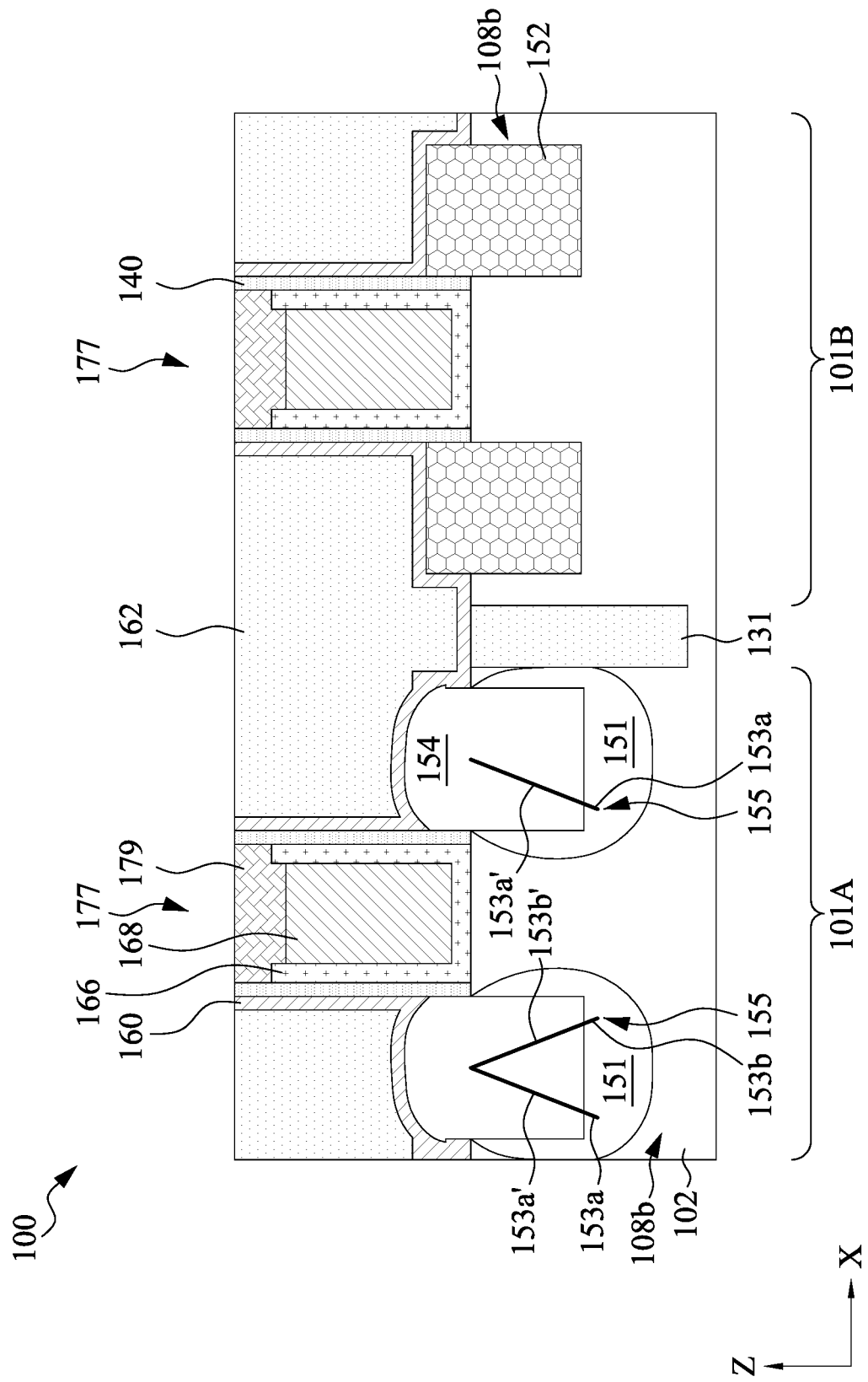

In FIG. 16, replacement gate structures 177 are formed. The replacement gate structure 177 may include a gate dielectric layer 166 and a gate electrode layer 168 formed on the gate dielectric layer 166. The gate dielectric layer 166 is formed and in contact with the exposed fins 108a, 108b and the gate spacer 140. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AltiC, AlTiN, TaCN, TaC, TaSiN, metal alloys, other suitable materials, and/or combinations thereof. For NMOS devices in the region 101A, the gate electrode layer 168 may be AlTiO, AlTiC, or a combination thereof. For PMOS devices in the region 101B, the gate electrode layer 168 may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168. The MGEB process may be a plasma etching process employing one or more etchants such as chlorine-containing gas, a bromine-containing gas, and/or a fluorine-containing gas. After the MGEB process, a top surface of the gate electrode layer 168 may be lower than a top surface of the gate dielectric layer 166. In some embodiments, portions of the gate spacers 140 are etched back so that the top surface of the gate spacers 140 is higher than the top surfaces of the gate dielectric layer 166 and the gate electrode layer 168. Then, trenches formed above the gate dielectric layer 166 and the gate electrode layer 168 as a result of the MGEB processes are filled with a self-aligned contact (SAC) layer 179. The SAC layer 179 can be formed of any dielectric material that has different etch selectivity than the CESL 160 and serves as an etch stop layer during subsequent trench and via patterning for metal contacts. A CMP process is then performed to remove excess deposition of the SAC layer 179 until the top surface of the ILD layer 162 is exposed.

Figure 17:
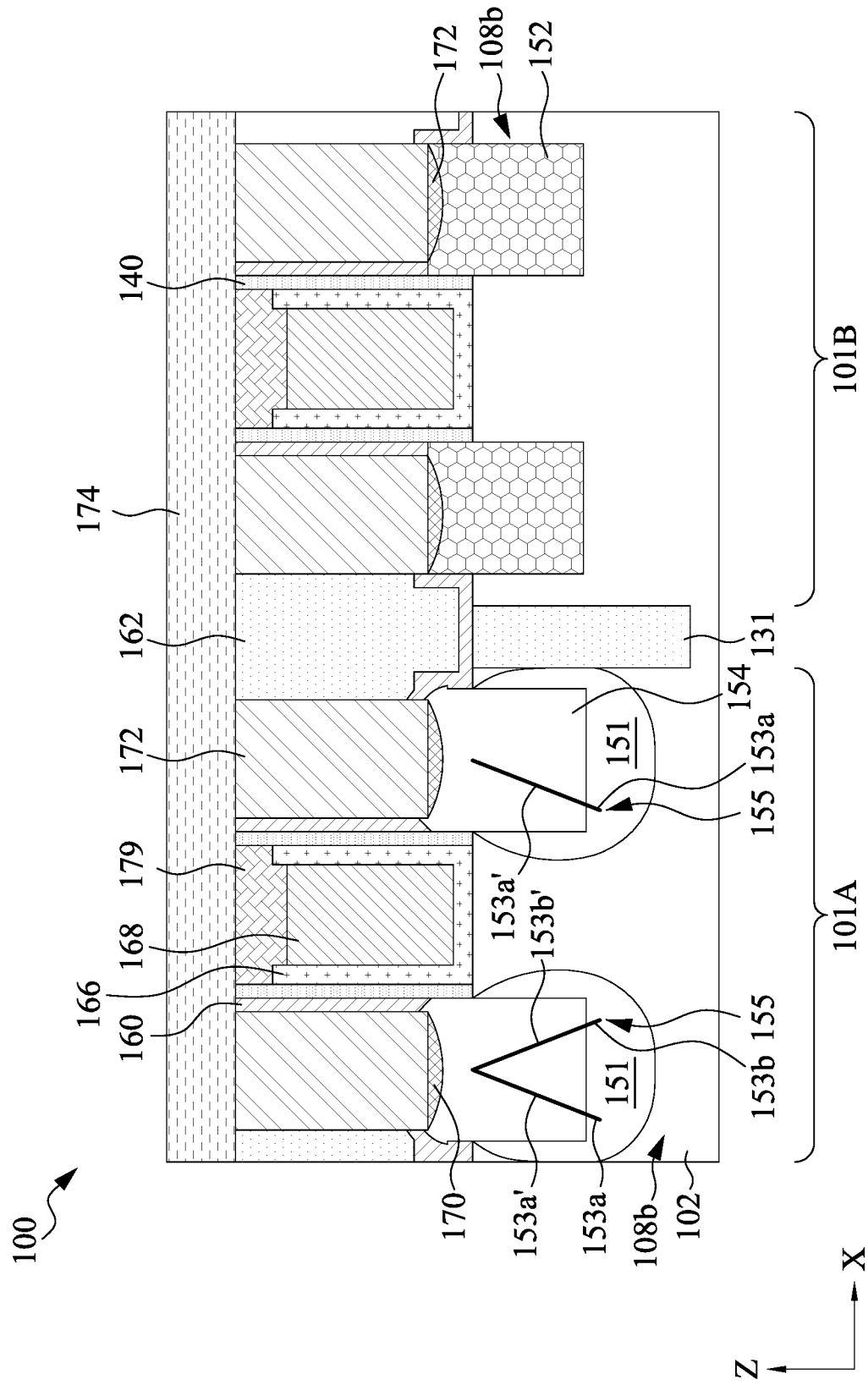

In FIG. 17, portions of the ILD layer 162 and the CESL 160 disposed on both sides of the replacement gate structures 177 are removed. The removal of the portions of the ILD layer 162 and the CESL 160 forms a contact opening exposing the S/D epitaxial features 152, 154, respectively. In some embodiments, an upper portion of the exposed S/D epitaxial features 152, 154 is removed. A conductive feature 172 (i.e., S/D contacts) is then formed in the contact openings over the S/D epitaxial features 152, 154. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. A silicide layer 170 may be formed between each S/D epitaxial feature 152, 154 and the conductive feature 172, as shown in FIGS. 14A-14D. The silicide layer 170 conductively couples the S/D epitaxial features 152, 154 to the conductive feature 172. The silicide layer 170 is a metal or metal alloy silicide, and the metal includes a noble metal, a refractory metal, a rare earth metal, alloys thereof, or combinations thereof. For n-channel FETs, the silicide layer 170 may include one or more of TiSi, CrSi, TaSi, MoSi, ZrSi, HfSi, ScSi, Ysi, HoSi, TbSI, GdSi, LuSi, DySi, ErSi, Yb Si, or combinations thereof. For p-channel FETs, the silicide layer 170 may include one or more of NiSi, CoSi, MnSi, Wsi, Fe Si, RhSi, PdSi, RuSi, PtSi, IrSi, OsSi, or combinations thereof. Once the conductive features 172 are formed, a planarization process, such as CMP, is performed on the semiconductor device structure 100 until the top surface of the SAC layer 179 (if used) is exposed.

An interconnect structure 174 is formed over the semiconductor device structure 100. The interconnect structure 174 may include one or more interlayer dielectrics and a plurality of interconnect features (not shown, such as conductive vias and lines) formed in each interlayer dielectric. The interconnect features may include or be formed of W, Ru, Co, Cu, Ti, TiN, Ta, TaN, Mo, Ni, or combinations thereof. The interlayer dielectrics may be formed of the same material as the ILD layer 162. A power rail (not shown) may be in electrical connection with the S/D epitaxial features 152, 154 through the S/D contacts (e.g., conductive feature 172) and the interconnect features. Depending on the application and/or conductivity type of the devices in the regions 101A, 101B, the power rail may be fed with a positive voltage (VDD) or a negative voltage (VS S) (i.e., ground or zero voltage).

Embodiments of present disclosure provide mechanisms for forming dislocations in source and drain regions between a gate structure of FinFET devices to improve mobility of carriers. The dislocations are formed by first amorphizing the source and drain regions, forming a stressor layer over the amorphized source and drain regions, and then recrystallizing the source and drain regions. Particularly, the stressor layer is formed by an ALD-based process for a duration of time that is sufficient to smooth out rough and uneven amorphous/crystalline interface of the amorphized source and drain regions. A smooth amorphous/crystalline interface improves the uniformity of the dislocations to be formed in the amorphized source and drain regions 141 during the subsequent annealing process. Uniform dislocations exert tensile stress in the source and drain regions (and S/D epitaxial features to be formed therein), which enhances carrier mobility in the channel region and thus device performance.

In one embodiment, a method for forming a semiconductor device structure is provided. The method includes forming a sacrificial gate structure over a portion of a semiconductor fin, forming a gate spacer on opposing sides of the sacrificial gate structure, forming an amorphized region in the semiconductor fin not covered by the sacrificial gate structure and the gate spacer, wherein the amorphized region has an amorphous-crystalline interface having a first roughness, forming a stressor layer over the amorphized region, wherein the formation of the stressor layer recrystallizes the amorphous-crystalline interface from the first roughness to a second roughness that is less than the first roughness, and subjecting the amorphized region to an annealing process to recrystallize the amorphized region to a crystalline region, and the crystalline region comprising a dislocation.

In another embodiment, a method for forming a semiconductor device structure is provided. The method includes forming a semiconductor fin from a substrate having a first region and a second region, forming a first sacrificial gate structure and a second sacrificial gate structure over a portion of the semiconductor fin at the first and second regions, respectively, forming amorphized regions in the semiconductor fin on opposing sides of the first sacrificial gate structure, wherein the amorphized regions has a substantial round profile, forming a stressor layer over the first and second sacrificial gate structures and the amorphized regions, wherein the stressor layer is formed by an ALD-based process for a duration of time so that the amorphized regions converts from the substantial round profile to a substantial square profile, annealing the substrate so that the amorphized regions are recrystallized to form crystalline regions having a first dislocation, forming a recess in the crystalline regions, and forming a source/drain epitaxial feature in the recess, wherein the source/drain epitaxial feature is formed with a second dislocation extending from the first dislocation.

In yet another embodiment, a method for forming a semiconductor device structure is provided. The method includes forming a sacrificial gate structure over a portion of a semiconductor fin, forming a gate spacer on opposing sides of the sacrificial gate structure, forming an amorphized region in the semiconductor fin not covered by the sacrificial gate structure and the gate spacer, wherein the amorphized region has an amorphous-crystalline interface having a first roughness, forming an oxide layer on the sacrificial gate structure and the amorphized region, forming a stressor layer on the oxide layer in a reaction chamber by subjecting the oxide layer to a deposition cycle comprising exposing the oxide layer to a silicon-containing precursor to form a monolayer of silicon, removing the silicon-containing precursor from the reaction chamber, exposing the monolayer of silicon to nitrogen radicals, and removing the nitrogen radicals from the reaction chamber, wherein the deposition cycle recrystallizes the amorphous-crystalline interface from the first roughness to a second roughness that is less than the first roughness, and subjecting the amorphized region to an annealing process to recrystallize the amorphized region to a crystalline region, and the crystalline region comprising a dislocation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, the method comprising:
forming a sacrificial gate structure over a portion of a semiconductor fin;
forming a gate spacer on opposing sides of the sacrificial gate structure;
forming an amorphized region in the semiconductor fin not covered by the sacrificial gate structure and the gate spacer, wherein the amorphized region has an amorphous-crystalline interface having a first roughness;
forming a stressor layer over the amorphized region, wherein the formation of the stressor layer recrystallizes the amorphous-crystalline interface from the first roughness to a second roughness that is less than the first roughness; and
subjecting the amorphized region to an annealing process to recrystallize the amorphized region to a crystalline region, and the crystalline region comprising a first dislocation.

2. The method of claim 1, wherein the second roughness and the first roughness are at a ratio of about 1:10 to about 1:30.

3. The method of claim 2, wherein the stressor layer is formed by a plasma-enhanced atomic layer deposition (PEALD) process.

4. The method of claim 3, wherein the PEALD process is performed at a temperature of about 400 degrees Celsius for at least 4 hours.

5. The method of claim 1, further comprising:
forming an oxide layer between the sacrificial gate structure and the stressor layer.

6. The method of claim 1, wherein the annealing process includes a preheat stage heating the amorphized region to a temperature of about 400 degrees Celsius to about 620 degrees Celsius.

7. The method of claim 6, wherein the annealing process is a spike anneal heating the amorphized region to a temperature of about 900 degrees Celsius and about 1100 degrees Celsius.

8. The method of claim 1, further comprising:
after subjecting the amorphized region to an annealing process, removing portions of the dislocation and the crystalline region to form a trench; and
epitaxially forming a source/drain epitaxial feature in the trench, the source/drain epitaxial feature is formed with a second dislocation extending from the first dislocation.

9. A method for forming a semiconductor device structure, the method comprising:
forming a semiconductor fin from a substrate having a first region and a second region;
forming a first sacrificial gate structure and a second sacrificial gate structure over a portion of the semiconductor fin at the first and second regions, respectively;
forming amorphized regions in the semiconductor fin on opposing sides of the first sacrificial gate structure, wherein the amorphized regions has a substantial round profile;
forming a stressor layer over the first and second sacrificial gate structures and the amorphized regions, wherein the stressor layer is formed by an ALD-based process for a duration of time so that the amorphized regions converts from the substantial round profile to a substantial square profile;
annealing the substrate so that the amorphized regions are recrystallized to form crystalline regions having a first dislocation;
forming a recess in the crystalline regions; and
forming a source/drain epitaxial feature in the recess, wherein the source/drain epitaxial feature is formed with a second dislocation extending from the first dislocation.

10. The method of claim 9, wherein the ALD-based process is a PEALD process.

11. The method of claim 10, wherein the PEALD process is performed in a temperature range of about 350 degrees Celsius to about 400 degrees Celsius for at least 4 hours or longer.

12. The method of claim 9, further comprising:
prior to forming a recess in the crystalline regions, removing the stressor layer.

13. The method of claim 12, further comprising:
after forming a source/drain epitaxial feature in the recess, forming a contact etch stop layer (CESL) on the source/drain epitaxial feature, wherein the CESL is in contact with a portion of the crystalline regions.

14. The method of claim 9, further comprising:
forming an oxide layer between the sacrificial gate structure and the stressor layer.

15. The method of claim 14, wherein the oxide layer has a first thickness and the stressor layer has a second thickness, and the first thickness and the second thickness is at a ratio of about 1:8 to about 1:20.

16. The method of claim 9, wherein the stressor layer is silicon carbide.

17. The method of claim 9, wherein the stressor layer is boron carbide.

18. A method for forming a semiconductor device structure, the method comprising:
forming a sacrificial gate structure over a portion of a semiconductor fin;
forming a gate spacer on opposing sides of the sacrificial gate structure;
forming an amorphized region in the semiconductor fin not covered by the sacrificial gate structure and the gate spacer, wherein the amorphized region has an amorphous-crystalline interface having a first roughness;
forming an oxide layer on the sacrificial gate structure and the amorphized region;
forming a stressor layer on the oxide layer in a reaction chamber by subjecting the oxide layer to a deposition cycle comprising exposing the oxide layer to a silicon-containing precursor to form a monolayer of silicon, removing the silicon-containing precursor from the reaction chamber, exposing the monolayer of silicon to nitrogen radicals, and removing the nitrogen radicals from the reaction chamber, wherein the deposition cycle recrystallizes the amorphous-crystalline interface from the first roughness to a second roughness that is less than the first roughness; and
subjecting the amorphized region to an annealing process to recrystallize the amorphized region to a crystalline region, and the crystalline region comprising a dislocation.

19. The method of claim 18, wherein the second roughness and the first roughness are at a ratio of about 1:10 to about 1:30.

20. The method of claim 18, wherein the deposition cycle is performed at a temperature of about 400 degrees Celsius for at least 4 hours or longer.

* * * * *